(12) United States Patent
Feng et al.

(10) Patent No.: US 10,916,213 B2
(45) Date of Patent: Feb. 9, 2021

(54) SHIFT REGISTER AND METHOD FOR DRIVING THE SAME, GATE DRIVING CIRCUIT, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Bo Feng, Beijing (CN); Shijun Wang, Beijing (CN); Xi Chen, Beijing (CN); Hongming Zhan, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/470,835

(22) PCT Filed: Jul. 12, 2018

(86) PCT No.: PCT/CN2018/095479
§ 371 (c)(1),
(2) Date: Jun. 18, 2019

(87) PCT Pub. No.: WO2019/062281
PCT Pub. Date: Apr. 4, 2019

(65) Prior Publication Data
US 2019/0311691 A1    Oct. 10, 2019

(30) Foreign Application Priority Data
Sep. 26, 2017  (CN) .......................... 2017 1 0884210

(51) Int. Cl.
*G11C 19/00* (2006.01)
*G09G 3/36* (2006.01)
*G11C 19/28* (2006.01)

(52) U.S. Cl.
CPC ............. *G09G 3/3677* (2013.01); *G09G 3/36* (2013.01); *G09G 3/3696* (2013.01); *G11C 19/28* (2013.01);
(Continued)

(58) Field of Classification Search
None
See application file for complete search history.

(56) References Cited

U.S. PATENT DOCUMENTS 9,767,753 B2   9/2017 Park et al.
2013/0088265 A1   4/2013 Chen
(Continued)

FOREIGN PATENT DOCUMENTS

CN   102629444 A   8/2012
CN   103050106 A   4/2013
(Continued)

OTHER PUBLICATIONS

First Office Action issued in Chinese Application No. 20170884210.5, dated Mar. 4, 2019, with English translation.
(Continued)

*Primary Examiner* — Tuan T Lam
(74) *Attorney, Agent, or Firm* — McDermott Will and Emery LLP

(57) ABSTRACT

A shift register includes first, second and third output sub-circuits, first and second pull-down sub-circuits, and a selection sub-circuit. The first output sub-circuit is coupled to a pull-up node, a first output terminal, and a first clock signal terminal. The second output sub-circuit is coupled to the first clock signal terminal, the selection sub-circuit, and a second output terminal. The third output sub-circuit is coupled to a second clock signal terminal, the selection sub-circuit, and the second output terminal. The selection sub-circuit is coupled to the second and third output sub- (Continued)

circuits, the pull-up node, and a gating signal terminal. The first pull-down sub-circuit is coupled to a first pull-down node, the first output terminal, a second voltage terminal, and the pull-up node. The second pull-down sub-circuit is coupled to the second output terminal, a first voltage terminal, and the first pull-down node.

20 Claims, 10 Drawing Sheets

(52) U.S. Cl.
CPC . *G09G 2310/0286* (2013.01); *G09G 2310/08* (2013.01); *G09G 2330/023* (2013.01)

(56) References Cited

U.S. PATENT DOCUMENTS

| | | | | |
|---|---|---|---|---|
| 2014/0169518 | A1* | 6/2014 | Kong | G09G 3/3674 377/64 |
| 2014/0176410 | A1 | 6/2014 | Ma et al. | |
| 2015/0029083 | A1 | 1/2015 | He | |
| 2015/0221265 | A1 | 8/2015 | Huang et al. | |
| 2015/0325181 | A1* | 11/2015 | Wang | G11C 19/28 377/64 |
| 2015/0332784 | A1 | 11/2015 | Yan | |
| 2016/0246418 | A1* | 8/2016 | Wang | G11C 19/184 |
| 2017/0032733 | A1 | 2/2017 | Jang | |
| 2017/0076680 | A1 | 3/2017 | Li et al. | |
| 2019/0392916 | A1* | 12/2019 | Gu | G11C 19/287 |
| 2020/0051655 | A1* | 2/2020 | Dong | G09G 3/20 |
| 2020/0135287 | A1* | 4/2020 | Han | G09G 3/3677 |

FOREIGN PATENT DOCUMENTS

| | | |
|---|---|---|
| CN | 103236248 A | 8/2013 |
| CN | 103390392 A | 11/2013 |
| CN | 105047172 A | 11/2015 |
| CN | 106409203 A | 2/2017 |
| CN | 106531053 A | 3/2017 |
| CN | 107403612 A | 11/2017 |
| KR | 10-2007-0105001 A | 10/2007 |

OTHER PUBLICATIONS

International Search Report and Written Opinion issued in corresponding International Application No. PCT/CN2018/095479, dated Oct. 22, 2018, with English translation.
International Search Report issued in Application No. PCT/CN2018/095479 dated Oct. 22, 2018, with English translation.

* cited by examiner

SHIFT REGISTER AND METHOD FOR DRIVING THE SAME, GATE DRIVING CIRCUIT, AND DISPLAY DEVICE

CROSS-REFERENCE TO RELATED APPLICATION

This application is a national phase entry under 35 USC 371 of International Patent Application No. PCT/CN2018/095479 filed on Jul. 12, 2018, which claims priority to Chinese Patent Application No. 201710884210.5, filed with the Chinese Patent Office on Sep. 26, 2017, titled "SHIFT REGISTER UNIT AND METHOD FOR DRIVING THE SAME, GATE DRIVING CIRCUIT, AND DISPLAY DEVICE", which are incorporated herein by reference in their entirety.

TECHNICAL FIELD

The present disclosure relates to the field of display technologies, and in particular, to a shift register and a method for driving the same, a gate driving circuit, and a display device.

BACKGROUND

As a flat panel display device, thin-film-transistor liquid-crystal display (TFT-LCD) is a common type of display at present. With the introduction of increasingly stringent energy consumption standards, reducing power consumption has become an important development direction of TFT-LCD technology.

SUMMARY

In an aspect, a shift register is provided, which includes a first output sub-circuit, a second output sub-circuit, a third output sub-circuit, a first pull-down sub-circuit, a second pull-down sub-circuit, and a selection sub-circuit. The first output sub-circuit is coupled to a pull-up node, a first output terminal, and a first clock signal terminal; and the first output sub-circuit is configured to output a signal from the first clock signal terminal to the first output terminal under control of the pull-up node. The second output sub-circuit is coupled to the first clock signal terminal, the selection sub-circuit, and a second output terminal; and the second output sub-circuit is configured to output a signal from the first clock signal terminal to the second output terminal under control of the selection sub-circuit. The third output sub-circuit is coupled to a second clock signal terminal, the selection sub-circuit, and the second output terminal; and the third output sub-circuit is configured to output a signal from the second clock signal terminal to the second output terminal under control of the selection sub-circuit. The selection sub-circuit is coupled to the second output sub-circuit, the third output sub-circuit, the pull-up node, and a gating signal terminal; and the selection sub-circuit is configured, under control of the gating signal terminal, such that the second outputs sub-circuit to output a signal from the first clock signal terminal under control of a signal from the pull-up node, or that the third output sub-circuit outputs a signal from the second clock signal terminal under control of a signal from the pull-up node.

In some embodiments of the present disclosure, the gating signal terminal includes a first gating signal terminal and a second gating signal terminal. The selection sub-circuit is configured, under control of the first gating signal terminal, such that the second output sub-circuit outputs a signal from the first clock signal terminal under control of a signal from the pull-up node; or, the selection sub-circuit is configured, under control of the second gating signal terminal, such that the third output sub-circuit outputs a signal from the second clock signal terminal under control of a signal from the pull-up node.

In some embodiments of the present disclosure, the first input sub-circuit includes a first transistor. A gate of the first transistor is coupled to the pull-up node, a first electrode of the first transistor is coupled to the first clock signal terminal, and a second electrode of the first transistor is coupled to the first output terminal.

In some embodiments of the present disclosure, the selection sub-circuit includes a second transistor and a third transistor. A gate of the second transistor is coupled to the first gating signal terminal, a first electrode of the second transistor is coupled to the second output sub-circuit, and a second electrode of the second transistor is coupled to the pull-up node. A gate of the third transistor is coupled to the second gating signal terminal, a first electrode of the third transistor is coupled to the third output sub-circuit, and a second electrode of the third transistor is coupled to the pull-up node.

In some embodiments of the present disclosure, the second output sub-circuit includes a fourth transistor and a first capacitor. A gate of the fourth transistor is coupled to the first electrode of the second transistor, a first electrode of the fourth transistor is coupled to the first clock signal terminal, and a second electrode of the fourth transistor is coupled to the second output terminal. One electrode of the first capacitor is coupled to the pull-up node, and another electrode of the first capacitor is coupled to the second output terminal.

In some embodiments of the present disclosure, the third output sub-circuit includes a fifth transistor. A gate of the fifth transistor is coupled to the first electrode of the third transistor, a first electrode of the fifth transistor is coupled to the second clock signal terminal, and a second electrode of the fifth transistor is coupled to the second output terminal.

In some embodiments of the present disclosure, the first pull-down sub-circuit includes a sixth transistor and a seventh transistor. A gate of the sixth transistor is coupled to the first pull-down node, a first electrode of the sixth transistor is coupled to the first output terminal, and a second electrode of the sixth transistor is coupled to the second voltage terminal. A gate of the seventh transistor is coupled to the first pull-down node, a first electrode of the seventh transistor is coupled to the pull-up node, and a second electrode of the seventh transistor is coupled to the second voltage terminal.

In some embodiments of the present disclosure, the second pull-down sub-circuit includes an eighth transistor. A gate of the eighth transistor is coupled to the first pull-down node, a first electrode of the eighth transistor is coupled to the second out terminal, and a second electrode of the eighth transistor is coupled to the first voltage terminal.

In some embodiments of the present disclosure, the shift register further includes a pull-up control sub-circuit and a pull-down control sub-circuit. The pull-up control sub-circuit is coupled to a first input terminal, a second input terminal, the second voltage terminal, a third voltage terminal, and the pull-up node. The pull-up control sub-circuit is configured to output a voltage from the third voltage terminal to the pull-up node under control of the first input terminal. Or, the pull-up control sub-circuit is configured to pull down a potential of the pull-up node to a potential at the second voltage terminal under control of the second input terminal. The pull-down control sub-circuit is coupled to the pull-up node, a first pull-down node, the second voltage terminal, and a fourth voltage terminal. The pull-down control sub-circuit is configured to output a voltage from the fourth voltage terminal to the first pull-down node under control of the fourth voltage terminal. Or, the pull-down control sub-circuit is configured to pull down a potential of the first pull-down node to a potential at the second voltage terminal under control of the pull-up node.

In some embodiments of the present disclosure, the pull-up control sub-circuit includes a ninth transistor and a tenth transistor. A gate of the ninth transistor is coupled to the first input terminal, a first electrode of the ninth transistor is coupled to the third voltage terminal, and a second electrode of the ninth transistor is coupled to the pull-up node. A gate of the tenth transistor is coupled to the second input terminal, a first electrode of the tenth transistor is coupled to the pull-up node, and a second electrode of the tenth transistor is coupled to the second voltage terminal.

In some embodiments of the present disclosure, the pull-down control sub-circuit includes an eleventh transistor, a twelfth transistor, a thirteenth transistor, and a fourteenth transistor. A gate and a first electrode of the eleventh transistor are coupled to the fourth voltage terminal, and a second electrode of the eleventh transistor is coupled to a first electrode of the thirteenth transistor and a gate of the twelfth transistor. A first electrode of the twelfth transistor is coupled to the fourth voltage terminal, and a second electrode of the twelfth transistor is coupled to the first pull-down node. A gate of the thirteenth transistor is coupled to the pull-up node, and a second electrode of the thirteenth transistor is coupled to the second voltage terminal. A gate of the fourteenth transistor is coupled to the pull-up node, a first electrode of the fourteenth transistor is coupled to the first pull-down node, and a second electrode of the fourteenth transistor is coupled to the second voltage terminal.

In some embodiments of the present disclosure, the shift register further includes a discharging sub-circuit. The discharging sub-circuit is coupled to a third input terminal, the pull-up node, and the second voltage terminal. The discharging sub-circuit is configured to pull down a potential of the pull-up node to a potential at the second voltage terminal under control of the third input terminal.

In some embodiments of the present disclosure, the discharging sub-circuit includes a fifteenth transistor. A gate of the fifteenth transistor is coupled to the third input terminal, a first electrode of the fifteenth transistor is coupled to the pull-up node, and a second electrode of the fifteenth transistor is coupled to the second voltage terminal.

In some embodiments of the present disclosure, the shift register further includes a backup first pull-down sub-circuit, a backup second pull-down sub-circuit, and a backup pull-down control sub-circuit. The backup first pull-down sub-circuit is coupled to a second pull-down node, the first output terminal, the second voltage terminal, and the pull-up node. The backup first pull-down sub-circuit is configured to pull down potentials at the first output terminal and the pull-up node to a potential at the second voltage terminal under control of the second pull-down node. The backup second pull-down sub-circuit is coupled to the second output terminal, the first voltage terminal, and the second pull-down node. The backup second pull-down sub-circuit is configured to pull down a potential at the second output terminal to a potential at the first voltage terminal under control of the second pull-down node. The backup pull-down control sub-circuit is coupled to the pull-up node, the second pull-down node, the second voltage terminal, and a fifth voltage terminal. The backup pull-down control sub-circuit is configured to output a voltage from the fifth voltage terminal to the second pull-down node under control of the fifth voltage terminal. Or, the backup pull-down control sub-circuit is configured to pull down a potential of the second pull-down node to a potential at the second voltage terminal under control of the pull-up node.

In some embodiments of the present disclosure, the backup first pull-down sub-circuit includes a sixteenth transistor and a seventeenth transistor. A gate of the sixteenth transistor is coupled to the second pull-down node, a first electrode of the sixteenth transistor is coupled to the first output terminal, and a second electrode of the sixteenth transistor is coupled to the second voltage terminal. A gate of the seventeenth transistor is coupled to the second pull-down node, a first electrode of the seventeenth transistor is coupled to the pull-up node, and a second electrode of the seventeenth transistor is coupled to the second voltage terminal.

In some embodiments of the present disclosure, the backup second pull-down sub-circuit includes an eighteenth transistor. A gate of the eighteenth transistor is coupled to the second pull-down node, a first electrode of the eighteenth transistor is coupled to the second output terminal, and a second electrode of the eighteenth transistor is coupled to the first voltage terminal.

In some embodiments of the present disclosure, the backup pull-down control sub-circuit includes a nineteenth transistor, a twentieth transistor, a twenty-first transistor, and a twenty-second transistor. A gate and a first electrode of the nineteenth transistor are coupled to the fifth voltage terminal, and a second electrode of the nineteenth transistor is coupled to a first electrode of the twenty-first transistor and a gate of the twentieth transistor. A first electrode of the twentieth transistor is coupled to the fifth voltage terminal, and a second electrode of the twentieth transistor is coupled to the second pull-down node. A gate of the twenty-first transistor is coupled to the pull-up node, and a second electrode of the twenty-first transistor is coupled to the second voltage terminal. A gate of the twenty-second transistor is coupled to the pull-up node, a first electrode of the twenty-second transistor is coupled to the second pull-down node, and a second electrode of the twenty-second transistor is coupled to the second voltage terminal.

In another aspect, a method for driving the shift register according the first aspect is provided. The gating signal terminal includes a first gating signal terminal and a second gating signal terminal. The method includes: inputting a first voltage to the first gating signal terminal, and inputting a second voltage to the second gating signal terminal; outputting, by the second output sub-circuit, a signal from the first clock signal terminal to the second output terminal under control of the first voltage output from the first gating signal terminal and the pull-up node; and controlling the third output sub-circuit not to output signals by using the second voltage output from the second gating signal terminal and the pull-up node; or, outputting, by the third output sub-circuit, a signal from the second clock signal terminal to the second output terminal under control of the second voltage output from the second gating signal terminal and the pull-up node; and controlling the second output sub-circuit not to output signals by using the first voltage output from the first gating signal terminal and the pull-up node.

In yet another aspect, a gate driving circuit is provided, which includes a plurality of shift registers according to the first aspect coupled in cascade. First input terminals of a first-stage shift register, a second-stage shift register, and a third-stage shift register are coupled to a start signal terminal; except for the first-stage shift register, the second-stage shift register, and the third-stage shift register, a first input terminal of an Nth-stage shift register is coupled to a first output terminal of an (N−3)th-stage shift register, wherein N is greater than 3, and N is a positive integer. Except for last four stages of shift registers, a second input terminal of an Kth-stage shift register is coupled to a first output terminal of an (K+4)th-stage shift register, K is greater than or equal to 1, and K is a positive integer; and second input terminals of the last four stages of shift registers are coupled to a second signal terminal.

In yet another aspect, a display device is provided, which includes the gate driving circuit described above.

BRIEF DESCRIPTION OF THE DRAWINGS

In order to describe technical solutions in some embodiments of the present disclosure or in the prior art more clearly, the accompanying drawings to be used in the description of embodiments or in the prior art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
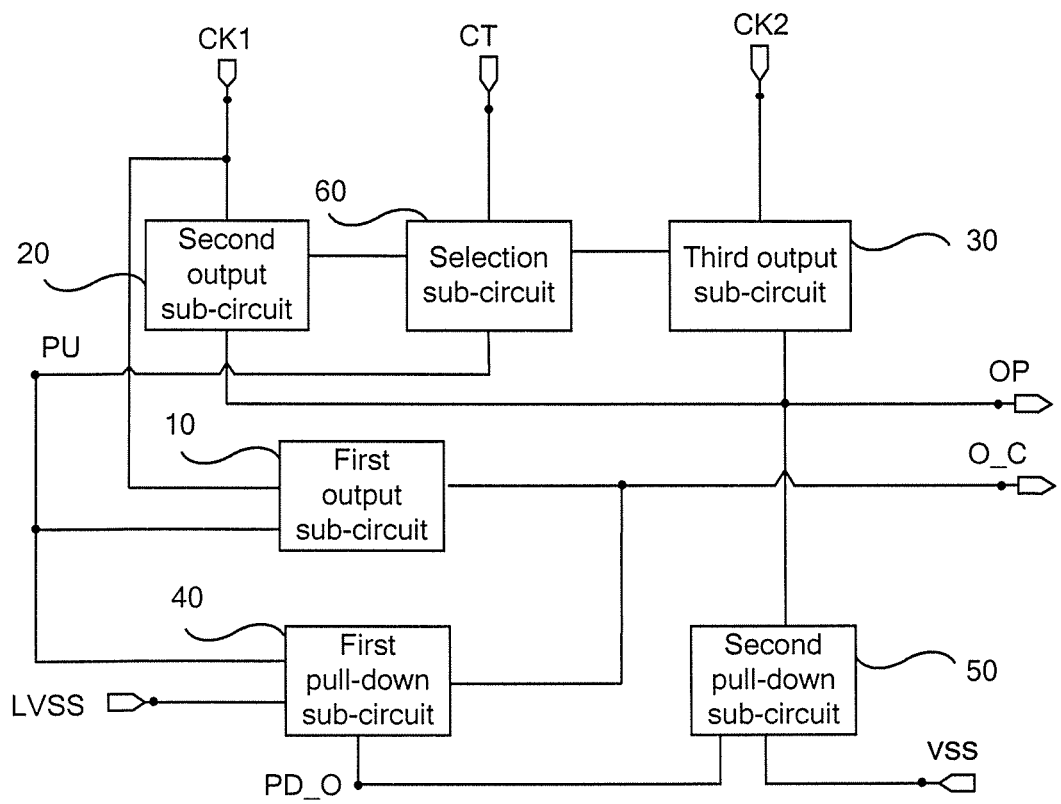
FIG. 1 is a schematic diagram showing sub-circuits of a shift register, according to some embodiments of the present disclosure.

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In order to avoid aging of liquid crystal molecules in a liquid crystal layer of a TFT-LCD, in a process of driving the TFT-LCD to display content, polarities of data voltages input to data lines can be reversed, so as to increase a frequency at which the liquid crystal molecules are deflected, and reduce a rate at which the liquid crystal molecules age. A manner of polarity inversion may be dot inversion, column inversion or row inversion.

Taking dot inversion as an example, the polarities of data voltages received by a same sub-pixel are opposite in two adjacent image frames, and in any image frame, a polarity of a data voltage received by a sub-pixel is opposite to a polarity of data voltages received by other sub-pixels surrounding the sub-pixel. In this case, in a process of turning on different rows of sub-pixels row by row, the data voltage on a same data line needs to be frequently switched from positive (or negative) to negative (or positive). As a result, the data voltage on the data line changes by a large amount, thereby increasing power consumption of a source driving circuit that supplies the data voltages to the data lines.

Based on this, the power consumption may be reduced by reducing the load of the source driving circuit, such as a resistance of each data line or a parasitic capacitance in each sub-pixel.

In addition, in a case where driving circuits of the TFT-LCD include gate driver on array (GOA) circuit(s), in embodiments of the present disclosure, the purpose of reducing the power consumption may also be achieved by adjusting output timing(s) of the GOA circuit(s).

The GOA circuit described above includes a plurality of shift registers coupled in cascade. The GOA circuit may scan gate lines line by line. For example, in one image frame, the GOA circuit may scan the gate lines line by line, for example, from top to bottom. After all the gate lines are scanned, the scanning is returned to a first line from a last line, so as to re-scan the gate lines from top to bottom line by line when a next frame begins. Therefore, in the GOA circuit described above, except for a first-stage shift register and a last-stage shift register, a signal output terminal of a stage of shift register is coupled to a signal input terminal of a shift register in a next stage, and coupled to a reset signal terminal of a shift register in a previous stage. Therefore, a relative relationship among the shift registers in the GOA circuit is stable, and the gate lines can only be scanned line by line in order. Once an output timing of the signal output terminal is not in order, the stable relative relationship in the GOA circuit will be damaged, resulting in abnormal output of the GOA circuit.

In order to adjust the output timing of the GOA circuit, so as to reduce the power consumption and avoid abnormal output of the GOA circuit, some embodiments of the present disclosure provide a shift register. As shown in FIG. 1, the shift register includes a first output sub-circuit 10, a second output sub-circuit 20, a third output sub-circuit 30, a first pull-down sub-circuit 40, a second pull-down sub-circuit 50, and a selection sub-circuit 60.

The first output sub-circuit 10 is coupled to a pull-up node PU, a first output terminal OUT_C (abbreviated as O_C), and a first clock signal terminal CLK1 (abbreviated as CK1). The first output sub-circuit 10 is configured to output a signal from the first clock signal terminal CK1 to the first output terminal O_C under control of the pull-up node PU.

The second output sub-circuit 20 is coupled to the first clock signal terminal CK1, the selection sub-circuit 60, and a second output terminal OUTPUT (abbreviated as OP). The second output sub-circuit 20 is configured to output a signal from the first clock signal terminal CK1 to the second output terminal OP under control of the selection sub-circuit 60.

The third output sub-circuit 30 is coupled to a second clock signal terminal CLK2 (abbreviated as CK2), the selection sub-circuit 60, and the second output terminal OP. The third output sub-circuit 30 is configured to output a signal from the second clock signal terminal CK2 to the second output terminal OP under control of the selection sub-circuit 60.

The selection sub-circuit 60 is coupled to the second output sub-circuit 20, the third output sub-circuit 30, the pull-up node PU, and a gating signal terminal Control (abbreviated as CT). The selection sub-circuit 60 is configured, under control of the gating signal terminal CT, such that the second output sub-circuit 20 outputs a signal from the first clock signal terminal CK1 under control of a signal from the pull-up node PU, or that the third output sub-circuit 30 outputs a signal from the second clock signal terminal CK2 under control of a signal from the pull-up node PU.

The first pull-down sub-circuit 40 is coupled to a first pull-down node PD_O, the first output terminal O_C, a second voltage terminal LVSS, and the pull-up node PU. The first pull-down sub-circuit 40 is configured to pull down potentials at the first output terminal O_C and the pull-up node PU to a potential at the second voltage terminal LVSS under control of the first pull-down node PD_O.

The second pull-down sub-circuit 50 is coupled to the second output terminal OP, a first voltage terminal VSS, and the first pull-down node PD_O. The second pull-down sub-circuit 50 is configured to pull down a potential at the second output terminal OP to a potential at the first voltage terminal VSS under control of the first pull-down node PD_O.

Figure 14:
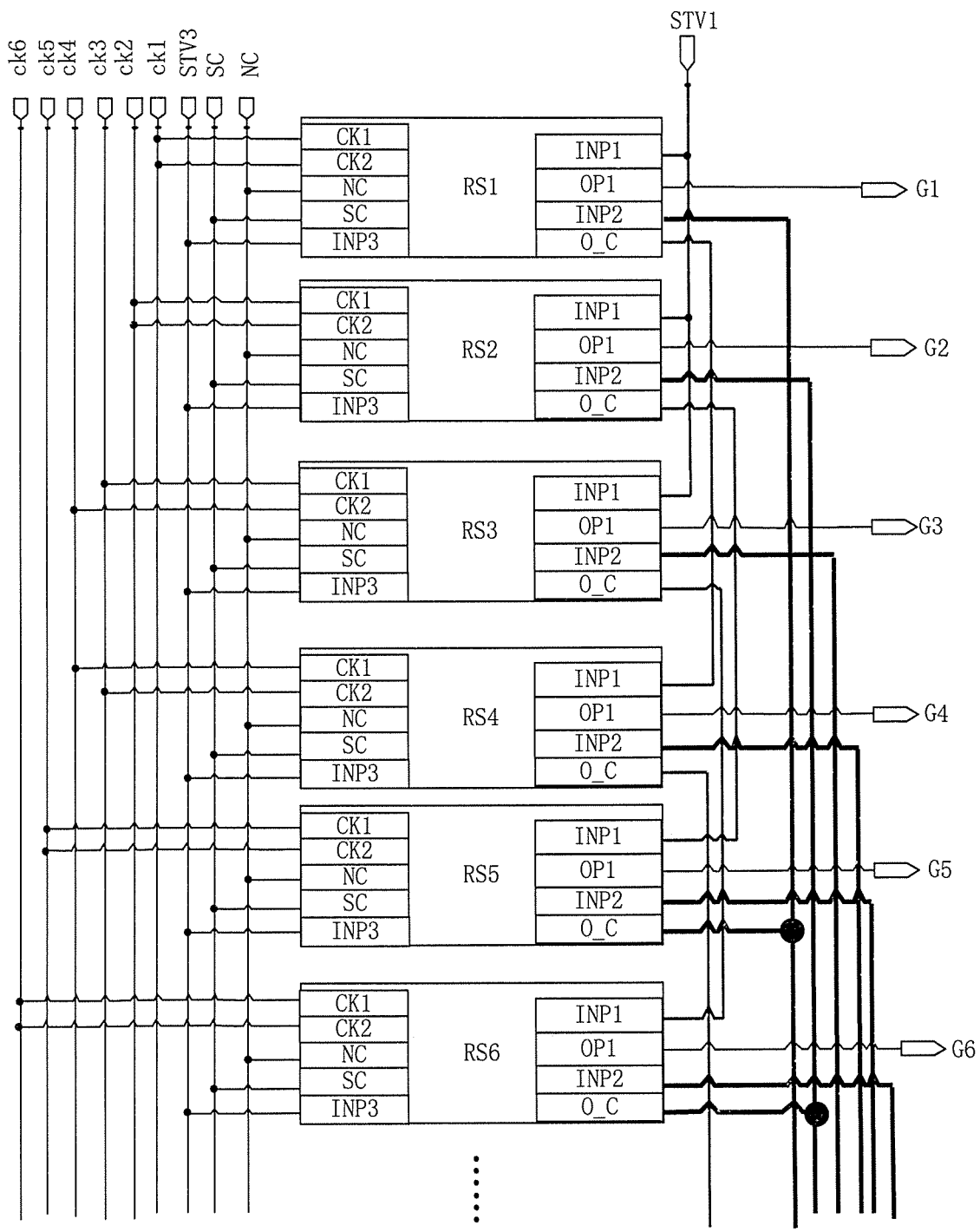
FIG. 14 is a schematic diagram showing a structure of first six stages of shift registers in a gate driving circuit formed by cascading multiple stages of shift registers shown in FIG. 2, FIG. 4, FIG. 6, or FIG. 8.
Figure 15:
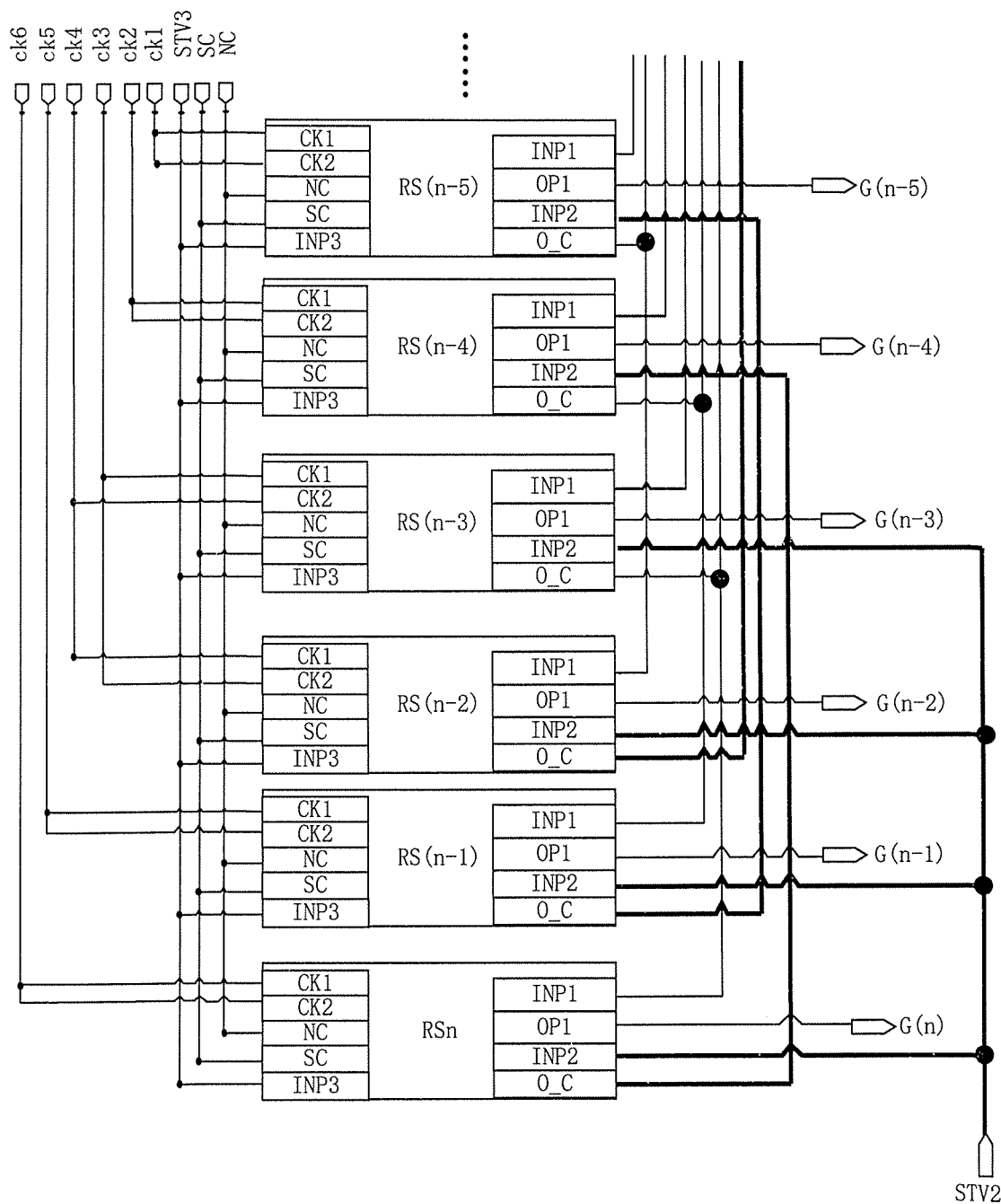
FIG. 15 is a schematic diagram showing a structure of last six stages of shift registers in a gate driving circuit formed by cascading multiple stages of shift registers shown in FIG. 2, FIG. 4, FIG. 6, or FIG. 8.

It will be noted that, in a case where the shift register provided in some embodiments of the present disclosure is used to form a gate driving circuit, as shown in FIG. 14 or 15, second output terminals OP of all stages of shift registers are sequentially coupled to gate lines in a display.

In addition, each stage of shift register further has a first output terminal O_C. For example, as shown in FIG. 14, except for a first-stage shift register (RS1), a second-stage shift register (RS2), and a third-stage shift register (RS3), a first input terminal INPUT1 (hereinafter abbreviated as INP1) of an Nth-stage shift register is coupled to a first output terminal O_C of an (N−3)th-stage shift register. N is greater than or equal to 3 (N≥3), and N is a positive integer.

In this case, the stages of shift registers configured to drive the gate lines located in an active display area may be cascaded through first output terminals O_C.

Based on this, the first output terminal O_C and the second output terminal OP of each stage of shift register are disposed independently of each other, so that a signal output via the second output terminal OP and a signal output via the first output terminal O_C do not interfere with each other.

In this case, in an output period of a shift register (e.g., RS1), the first output sub-circuit 10 of the shift register (e.g., RS1) outputs a signal from the first clock signal terminal CK1 to the first output terminal O_C under the control of the pull-up node PU. The first output terminal O_C transfers the signal from the first clock signal terminal CK1 to a first input terminal INP1 of a stage of shift register (e.g., RS4) coupled to the first output terminal O_C, so that RS4 enters a pre-charge period. In this case, all stages of shift registers may enter their respective pre-charge periods sequentially through the first output terminals O_C.

In addition, it can be known from the above that, second output terminals OP of all stages of shift registers are sequentially coupled to the gate lines in a display. In this case, when the gate driving circuit needs to scan the gate lines line by line, each stage of shift register outputs signals in a normal order. In this case, each stage of shift register outputs a signal of the first clock signal terminal CK1 as a gate line scanning signal to the second output terminal OP.

Figure 9A:
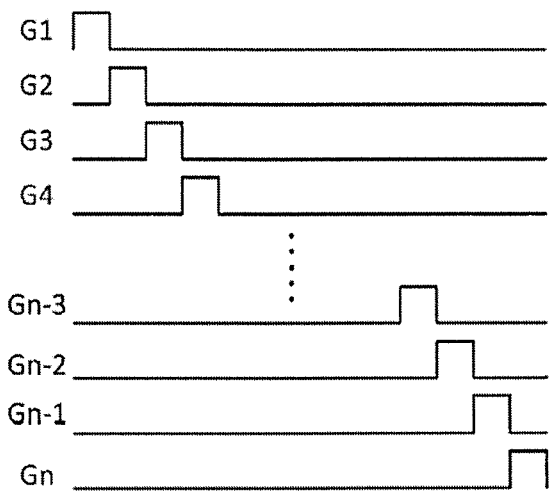
FIG. 9a is a timing diagram of gate line scanning signals output by the shift register shown in FIG. 1 in a normal order.

For example, as shown in FIG. 9a, all stages of shift registers sequentially output gate line scanning signals (G1, G2, G3 . . . and Gn) to the gate lines via second output terminals OP. That is, the shift registers sequentially output high level scanning signals to a first, a second, a third, a fourth . . . gate lines. In this case, the shift registers output signals in a normal order, wherein n is greater than or equal to 2 (n≥2), and n is a positive integer.

In order to make the shift registers output signals in a normal order, in each stage of shift register, the second output sub-circuit 20 may be made to output signals under the control of the pull-up node PU and the gating signal terminal CT, so that a signal of the first clock signal terminal CK1 may be output as a gate line scanning signal to a gate line coupled to the second output terminal OP.

For another example, in a case where second output terminals OP of all stages of shift registers are sequentially coupled to the gate lines in a display, in a case where the gate driving circuit does not scan the gate lines line by line, an order in which the stages of shift registers output gate scanning signals is different from an order in which the stages of shift registers are arranged. That is, the stages of shift registers do not output signals in the normal order. In this case, a signal of the second clock signal terminal CK2 is output as a gate line scanning signal to the second output terminal OP.

Figure 12:
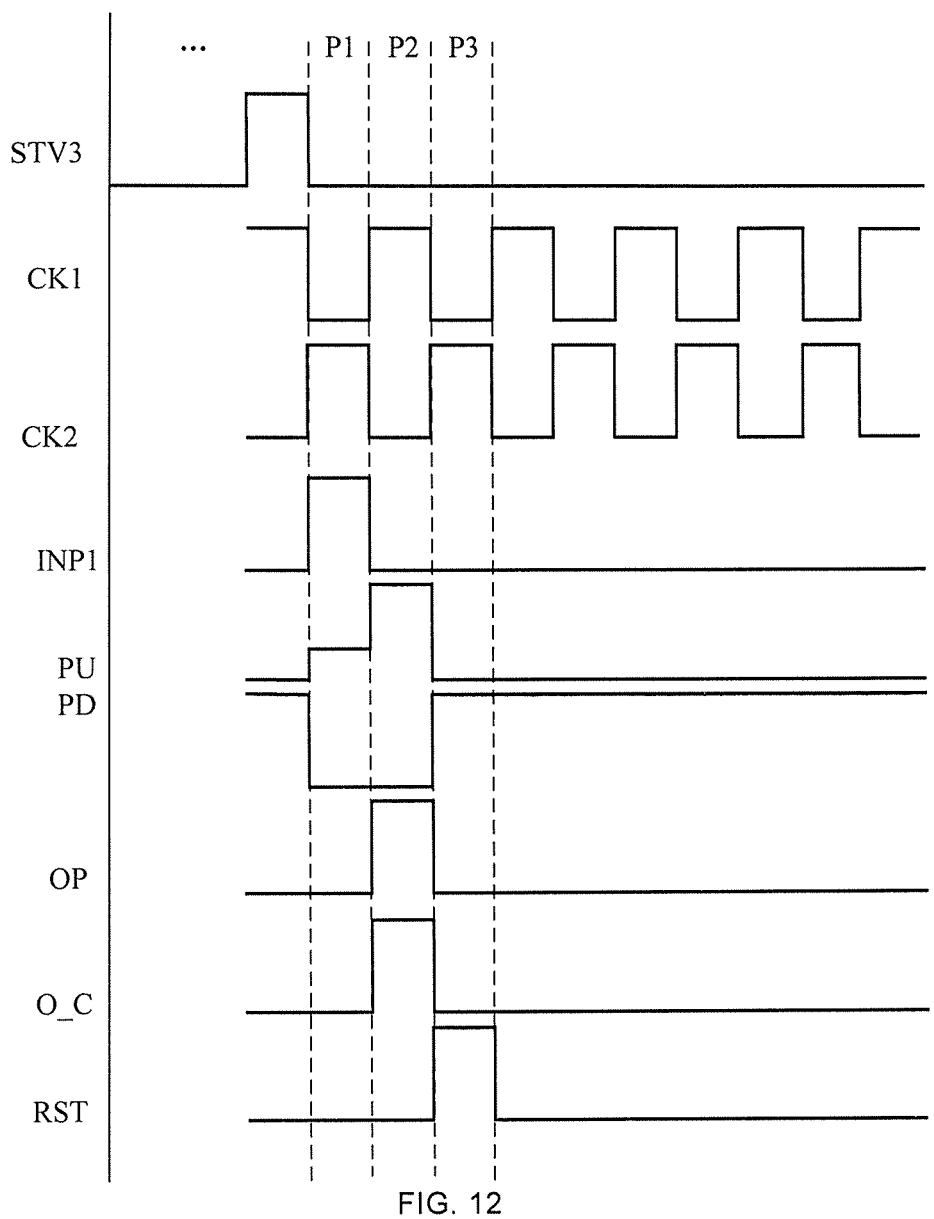
FIG. 12 is a timing diagram of control signals configured to drive the shift register shown in FIG. 6 to output signals in a normal order.

It will be noted that, the second clock signal terminal CK2 is provided by the user according to a demand for a desired order, and the signal of the first clock signal terminal CK1 is different from the signal of the second clock signal terminal CK2. For example, as shown in FIG. 12, a period of the signal of the second clock signal terminal CK2 may be the same as a period of the signal of the first clock signal terminal CK1, but a rising edge of the signal of the second clock signal terminal CK2 may appear later (or sooner) than a rising edge of the signal of the first clock signal terminal CK1.

Figure 9B:
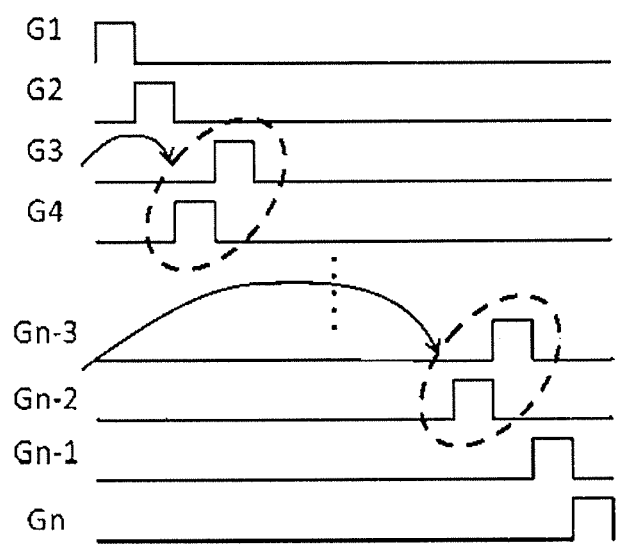
FIG. 9b is a timing diagram of gate line scanning signals output by the shift register shown in FIG. 1 in an exceptional order.

For example, as shown in FIG. 9b, the shift registers do not output gate line scanning signals (G1, G2, G3 . . . and Gn) via second output terminals OP to the gate lines in order.

For example, in first four gate lines, the shift registers first output high level scanning signals G1 and G2 to the first and second gate lines in order, then output a high level scanning signal G4 to the fourth gate line, and then output a high level scanning signal G3 to the third gate line, thereby realizing that the shift registers output signals in an exceptional order. In this case, a time of outputting a high level scanning signal to the third gate line is delayed relative to a time of outputting a high level scanning signal to the fourth gate line.

In order to cause shift registers to output signals in an exceptional order, in each stage of shift register, the third output sub-circuit 30 may be made to output signals under the control of the pull-up node PU and the gating signal terminal CT, so that the signal of the second clock signal terminal CK2 may be output as a gate line scanning signal to a gate line coupled to the second output terminal OP.

Based on this, if sub-pixels are driven in a manner of polarity inversion (for example, in first four rows of sub-pixels in FIG. 9b, data voltages received by sub-pixels in a first row and a third row through data lines have a positive polarity, and data voltages received by sub-pixels in a second row and a fourth row through data lines have a negative polarity), and in a case where the gate driving circuit adopts the driving mode of outputting signals in the above exceptional order, since the gate scanning signal is preferentially output to the fourth gate line than the third gate line, the fourth row of sub-pixels preferentially receive the data voltage than the third row of sub-pixels. It can be known from that above that, since data voltages received by sub-pixels in the second row and the fourth row through the data lines both have a negative polarity, there is no need to invert the polarity of data voltages output from the data lines to sub-pixels in the second row and the fourth row. Therefore, in a process of driving sub-pixels in a manner of polarity inversion, a number of times that polarities of data voltages are reversed on the data lines may be reduced by adjusting a timing of gate scanning signals output by the gate driving circuit, thereby achieving the purpose of reducing power consumption.

In addition, it can be known from the above that, since signals output from second output terminals OP of the shift registers configured to be coupled to the gate lines and signals output from first output terminals O_C configured to maintain a cascading relationship of the stages of shift registers do not interfere with each other, when the stages of shift registers output signals in an exceptional order, the signals output in the exceptional order will not affect a relative relationship among the stages of shift registers and thus will not cause abnormal output of the gate driving circuit on the whole.

In addition, some embodiments of the present disclosure do not limit a structure of the selection sub-circuit 60, as long as the second output sub-circuit 20 or the third output sub-circuit 30 is able to output signals under the control of the selection sub-circuit 60.

For example, the selection sub-circuit 60 includes an inverter. A signal directly output from the gating signal terminal CT can make the second output sub-circuit 20 output signals, and a signal output by the inverter makes the third output sub-circuit 30 not output signals. In this way, it is ensured that the selection sub-circuit 60 only selects one of the second output sub-circuit 20 and the third output sub-circuit 30 to output signals, so as to realize outputting signals in a normal order and in an exceptional order.

Figure 2:
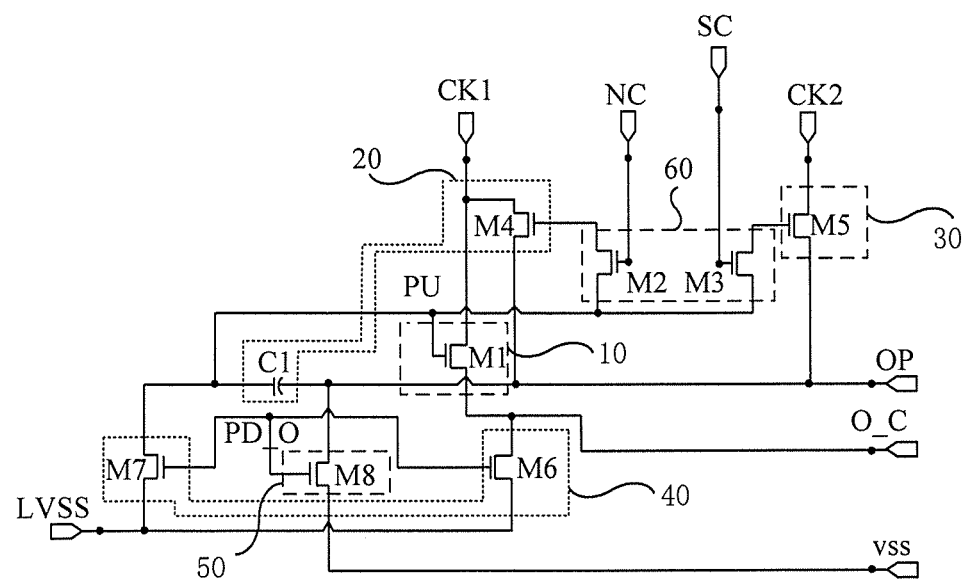
FIG. 2 is a schematic diagram showing a specific structure of the shift register shown in FIG. 1.

In some embodiments of the present disclosure, as shown in FIG. 2, the gating signal terminal CT includes a first gating signal terminal NC and a second gating signal terminal SC. The first gating signal terminal NC is coupled to the second output sub-circuit 20, and the second gating signal terminal SC is coupled to the third output sub-circuit 30.

In this case, the selection sub-circuit 60 is configured, under control of the first gating signal terminal NC, such that the second output sub-circuit 20 outputs signals under control of a signal from the pull-up node PU.

In addition, the selection sub-circuit 60 is further configured, under control of the second gating signal terminal SC, such that the third output sub-circuit 30 outputs signals under control of a signal from the pull-up node PU.

In addition, in a non-output period of the shift register, potentials at the first output terminal O_C and the pull-up node PU may be pulled down to a potential at the second voltage terminal LVSS by the first pull-down sub-circuit 40, and a potential at the second output terminal OP may be pulled down to a potential at the first voltage terminal VSS by the second pull-down sub-circuit 50. In this way, in the non-output period, a probability of false output of the first output terminal O_C and the second output terminal OP may be reduced.

Figure 3:
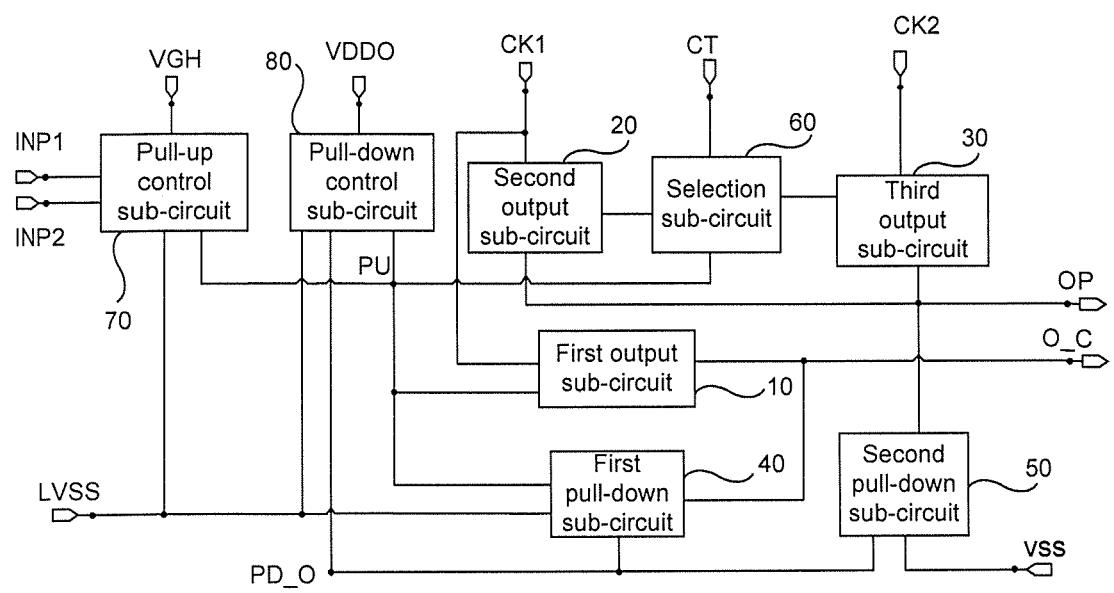
FIG. 3 is a schematic diagram showing sub-circuits of another shift register, according to some embodiments of the present disclosure.

On this basis, in order to realize control of the pull-up node PU and the first pull-down node PD_O, in some embodiments of the present disclosure, the shift register, as shown in FIG. 3, further includes a pull-up control sub-circuit 70 and a pull-down control sub-circuit 80.

The pull-up control sub-circuit 70 is coupled to a first input terminal INP1, a second input terminal INPUT2 (hereinafter abbreviated as INP2), the second voltage terminal LVSS, a third voltage terminal VGH, and the pull-up node PU. The pull-up control sub-circuit 70 is configured to output a voltage of the third voltage terminal VGH to the pull-up node PU under control of the first input terminal INP1. Or, the pull-up control sub-circuit 70 is configured to pull down a potential at the pull-up node PU to a potential at the second voltage terminal LVSS under control of the second input terminal INP2.

The pull-down control sub-circuit 80 is coupled to the pull-up node PU, the first pull-down node PD_O, the second voltage terminal LVSS, and a fourth voltage terminal VDDO. The pull-down control sub-circuit 80 is configured to output a voltage of the fourth voltage terminal VDDO to the first pull-down node PD_O under control of the fourth voltage terminal VDDO. Or, the pull-down control sub-circuit 80 is configured to pull down a potential at the first pull-down node PD_O to a potential at the second voltage terminal LVSS under the control of the pull-up node PU.

On this basis, after scanning one frame image, in order to prevent a signal of a previous image frame from affecting a signal of a next image frame (for example, to avoid cross-talk), it is necessary to discharge second output terminals OP of the stages of shift registers, so as to ensure that the signal of the previous image frame is eliminated.

Figure 5:
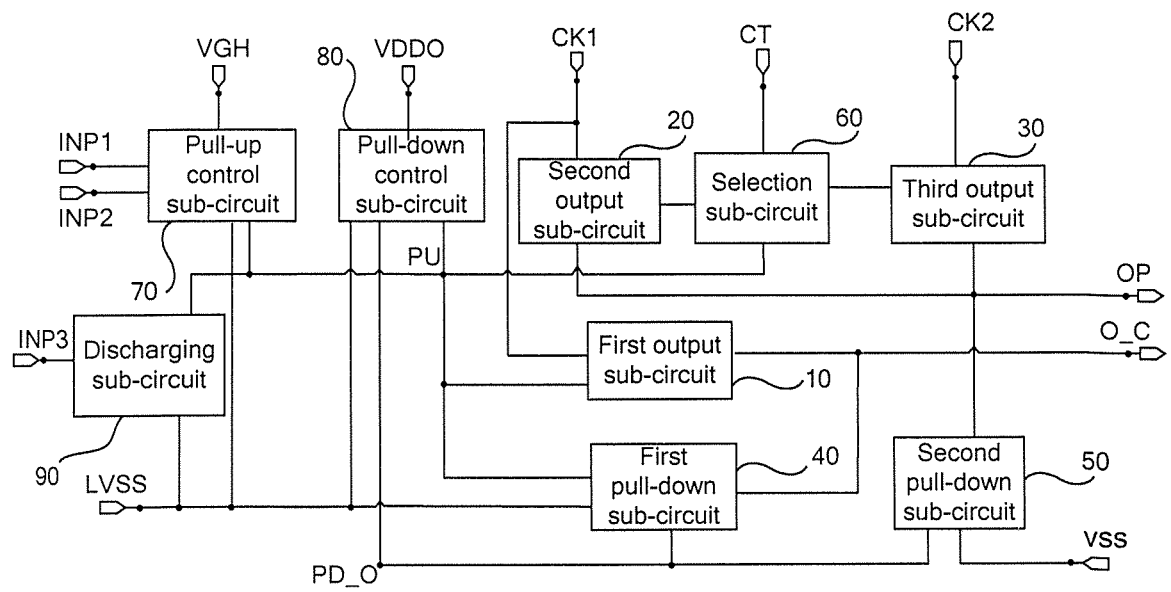
FIG. 5 is a schematic diagram showing sub-circuits, which include a discharging sub-circuit, of the shift register shown in FIG. 3.

In order to realize the above function, in some embodiments of the present disclosure, as shown in FIG. 5, the shift register further includes a discharging sub-circuit 90. The discharging sub-circuit 90 is coupled to a third input terminal INUPUT3 (abbreviated as INP3), the pull-up node PU, and the second voltage terminal LVSS. The discharging sub-circuit 90 is configured to pull down a potential at the pull-up node PU to a potential at the second voltage terminal LVSS under control of the third input terminal INP3.

In this way, in a case where the gate line scanning signal is in a high level, since the potential at the pull-up node PU is pulled down to a potential at the second voltage terminal LVSS, the high level of the first clock signal terminal CK1 cannot be output to the first output terminal O_C under the control of the pull-up node PU. As a result, when scanning of the next image frame begins, the signal of the previous image frame will not affect the signal of the next image frame.

Usually, in a display process of a shift register, if one or more of the above transistors fail, the shift register may malfunction and may not be able to output signals properly. Consequently, a service life of the shift register may easily be reduced.

Figure 7:
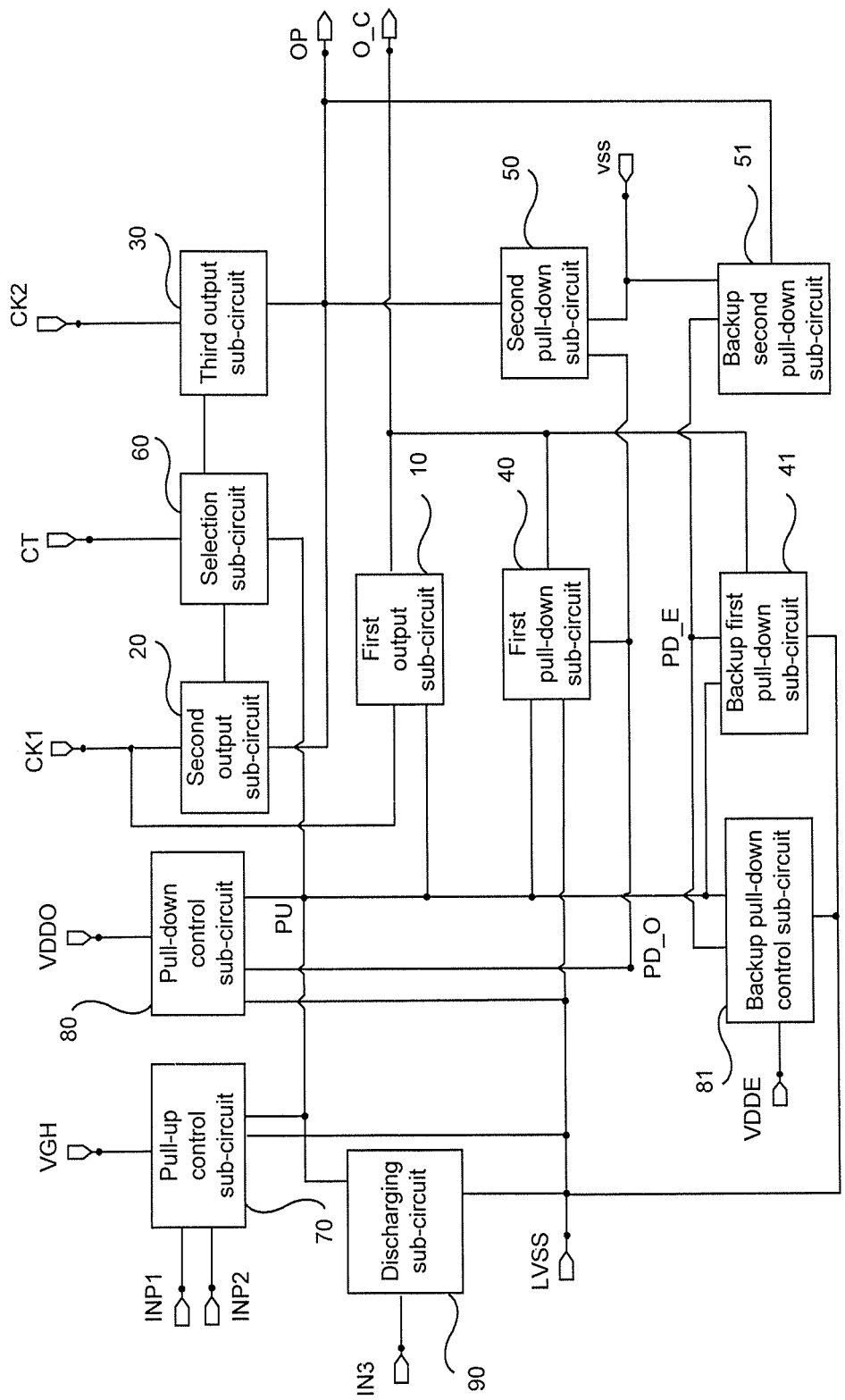
FIG. 7 is a schematic diagram showing sub-circuits, which include a backup pull-down control sub-circuit, a backup first pull-down sub-circuit, and a backup second pull-down sub-circuit, of the shift register shown in FIG. 5.

In order to solve the above problem, in some embodiments of the present disclosure, as shown in FIG. 7, the shift register further includes a backup first pull-down sub-circuit 41, a backup second pull-down sub-circuit 51, and a backup pull-down control sub-circuit 81.

The backup first pull-down sub-circuit 41 is coupled to a second pull-down node PD_E, the first output terminal O_C, the second voltage terminal LVSS, and the pull-up node PU. The backup first pull-down sub-circuit 41 is configured to pull down potentials at the first output terminal O_C and the pull-up node PU to a potential at the second voltage terminal LVSS under control of the second pull-down node PD_E.

The backup second pull-down sub-circuit 51 is coupled to the second output terminal OP, the first voltage terminal VSS, and the second pull-down node PD_E. The backup second pull-down sub-circuit 51 is configured to pull down a potential at the second output terminal OP to a potential at the first voltage terminal VSS under the control of the second pull-down node PD_E.

The backup pull-down control sub-circuit 81 is coupled to the pull-up node PU, the second pull-down node PD_E, the second voltage terminal LVSS, and a fifth voltage terminal VDDE. The backup pull-down control sub-circuit 81 is configured to output a voltage of the fifth voltage terminal VDDE to the second pull-down node PD_E under control of the fifth voltage terminal VDDE.

For another example, the backup pull-down control sub-circuit 81 is configured to pull down a potential at the second pull-down node PD_E to a potential at the second voltage terminal LVSS under control of the pull-up node PU.

Specific structures of sub-circuits in FIG. 1, FIG. 3, FIG. 5 or FIG. 7 are described in detail below.

In some embodiments, as shown in FIG. 2, the first output sub-circuit 10 includes a first transistor M1. A gate of the first transistor M1 is coupled to the pull-up node PU, a first electrode of the first transistor M1 is coupled to the first clock signal terminal CK1, and a second electrode of the first transistor M1 is coupled to the first output terminal O_C.

The selection sub-circuit 60 includes a second transistor M2 and a third transistor M3. A gate of the second transistor M2 is coupled to the first gating signal terminal NC, a first electrode of the second transistor M2 is coupled to the second output sub-circuit 20, and a second electrode of the second transistor M2 is coupled to the pull-up node PU. A gate of the third transistor M3 is coupled to the second gating signal terminal SC, a first electrode of the third transistor M3 is coupled to the third output sub-circuit 30, and a second electrode of the third transistor M3 is coupled to the pull-up node PU.

The second output sub-circuit 20 includes a fourth transistor M4 and a first capacitor C1. A gate of the fourth transistor M4 is coupled to the first electrode of the second transistor M2, a first electrode of the fourth transistor M4 is coupled to the first clock signal terminal CK1, and a second electrode of the fourth transistor M4 is coupled to the second output terminal OP. One electrode of the first capacitor C1 is coupled to the pull-up node PU, and another electrode of the first capacitor C1 is coupled to the second output terminal OP.

The third output sub-circuit 30 includes a fifth transistor M5. A gate of the fifth transistor M5 is coupled to the selection sub-circuit 60, a first electrode of the fifth transistor M5 is coupled to the second clock signal terminal CK2, and a second electrode of the fifth transistor M5 is coupled to the second output terminal OP.

The first pull-down sub-circuit 40 includes a sixth transistor M6 and a seventh transistor M7. A gate of the sixth transistor M6 is coupled to the first pull-down node PD_O, a first electrode of the sixth transistor M6 is coupled to the first output terminal O_C, and a second electrode of the sixth transistor M6 is coupled to the second voltage terminal LVSS. A gate of the seventh transistor M7 is coupled to the first pull-down node PD_O, a first electrode of the seventh transistor M7 is coupled to the pull-up node PU, and a second electrode of the seventh transistor M7 is coupled to the second voltage terminal LVSS.

The second pull-down sub-circuit 50 includes an eighth transistor M8. A gate of the eighth transistor M8 is coupled to the first pull-down node PD_O, a first electrode of the eighth transistor M8 is coupled to the second output terminal OP, and a second electrode of the eighth transistor M8 is coupled to the first voltage terminal VSS.

Figure 4:
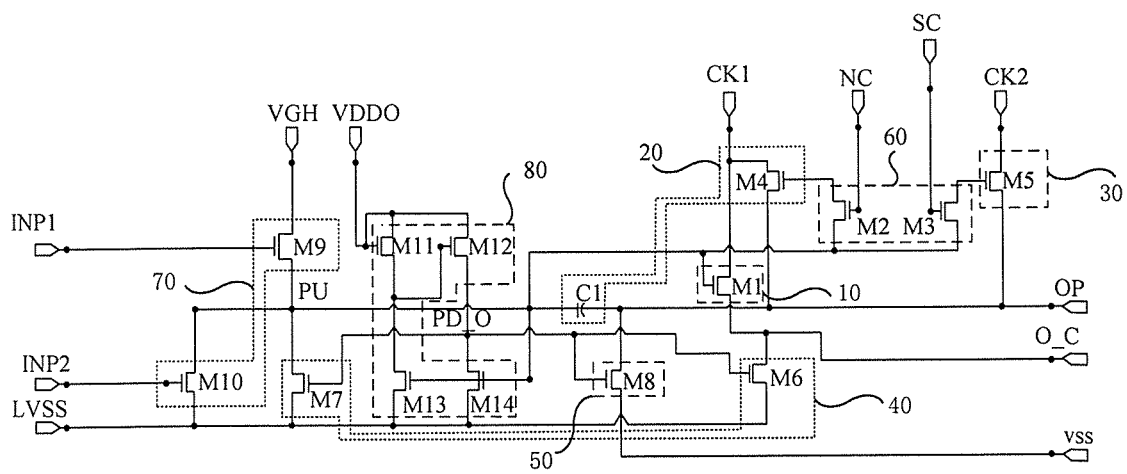
FIG. 4 is a schematic diagram showing a specific structure of the shift register shown in FIG. 3.

As shown in FIG. 4, the pull-up control sub-circuit 70 includes a ninth transistor M9 and a tenth transistor M10. A gate of the ninth transistor M9 is coupled to the first input terminal INP1, a first electrode of the ninth transistor M9 is coupled to the third voltage terminal VGH, and a second electrode of the ninth transistor M9 is coupled to the pull-up node PU. A gate of the tenth transistor M10 is coupled to the second input terminal INP2, a first electrode of the tenth transistor M10 is coupled to the pull-up node PU, and a second electrode of the tenth transistor M10 is coupled to the second voltage terminal LVSS.

The pull-down control sub-circuit 80 includes an eleventh transistor M11, a twelfth transistor M12, a thirteenth transistor M13, and a fourteenth transistor M14.

A gate and a first electrode of the eleventh transistor M11 are coupled to the fourth voltage terminal VDDO, and a second electrode of the eleventh transistor M11 is coupled to a first electrode of the thirteenth transistor M13 and a gate of the twelfth transistor M12.

A first electrode of the twelfth transistor M12 is coupled to the fourth voltage terminal VDDO, and a second electrode of the twelfth transistor M12 is coupled to the first pull-down node PD_O. A gate of the thirteenth transistor M13 is coupled to the pull-up node PU, and a second electrode of the thirteenth transistor M13 is coupled to the second voltage terminal LVSS.

A gate of the fourteenth transistor M14 is coupled to the pull-up node PU, a first electrode of the fourteenth transistor M14 is coupled to the first pull-down node PD_O, and a second electrode of the fourteenth transistor M14 is coupled to the second voltage terminal LVSS.

Figure 6:
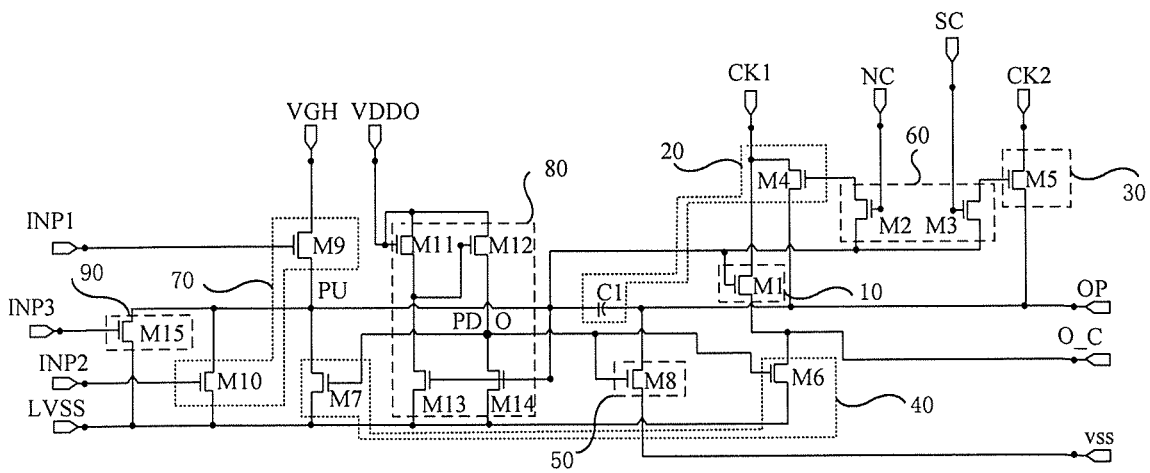
FIG. 6 is a schematic diagram showing a specific structure of the shift register shown in FIG. 5.

As shown in FIG. 6, the discharging sub-circuit 90 includes a fifteenth transistor M15. A gate of the fifteenth transistor M15 is coupled to the third input terminal INP3, a first electrode of the fifteenth transistor M15 is coupled to the pull-up node PU, and a second electrode of the fifteenth transistor M15 is coupled to the second voltage terminal LVSS.

Figure 8:
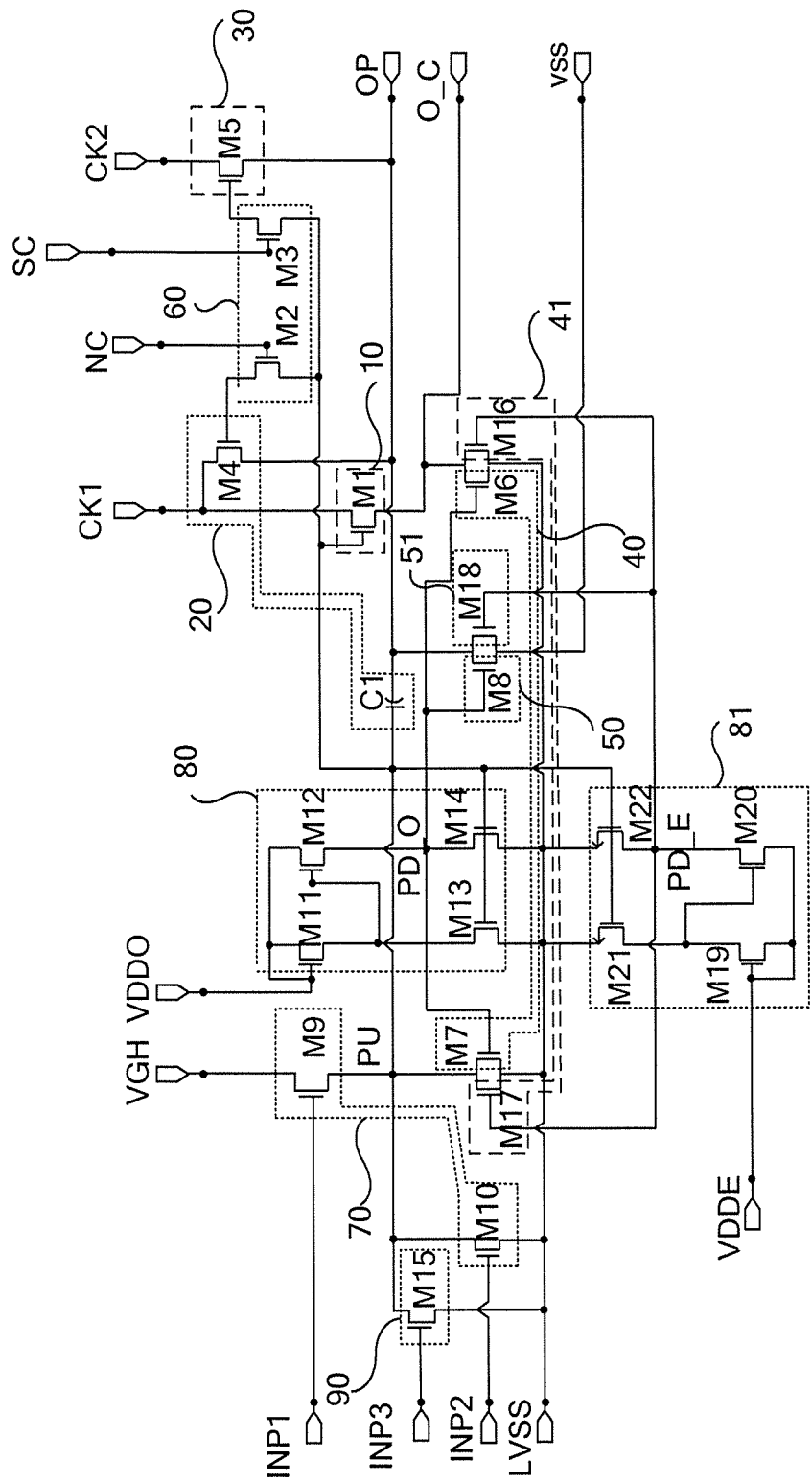
FIG. 8 is a schematic diagram showing a specific structure of the shift register shown in FIG. 7.

As shown in FIG. 8, the backup first pull-down sub-circuit 41 includes a sixteenth transistor M16 and a seventeenth transistor M17.

In some embodiments, a gate of the sixteenth transistor M16 is coupled to the second pull-down node PD_E, a first electrode of the sixteenth transistor M16 is coupled to the first output terminal O_C, and a second electrode of the sixteenth transistor M16 is coupled to the second voltage terminal LVSS.

A gate of the seventeenth transistor M17 is coupled to the second pull-down node PD_E, a first electrode of the seventeenth transistor M17 is coupled to the pull-up node PU, and a second electrode of the seventeenth transistor M17 is coupled to the second voltage terminal LVSS.

The backup second pull-down sub-circuit 51 includes an eighteenth transistor M18. A gate of the eighteenth transistor M18 is coupled to the second pull-down node PD_E, a first electrode of the eighteenth transistor M18 is coupled to the second output terminal OP, and a second electrode of the eighteenth transistor M18 is coupled to the first voltage terminal VSS.

The backup pull-down control sub-circuit 81 includes a nineteenth transistor M19, a twentieth transistor M20, a twenty-first transistor M21, and a twenty-second transistor M22.

A gate and a first electrode of the nineteenth transistor M19 are coupled to the fifth voltage terminal VDDE, and a second electrode of the nineteenth transistor M19 is coupled to a first electrode of the twenty-first transistor M21 and a gate of the twentieth transistor M20. A first electrode of the twentieth transistor M20 is coupled to the fifth voltage terminal VDDE, and a second electrode of the twentieth transistor M20 is coupled to the second pull-down node PD_E.

A gate of the twenty-first transistor M21 is coupled to the pull-up node PU, and a second electrode of the twenty-first transistor M21 is coupled to the second voltage terminal LVSS. A gate of the twenty-second transistor M22 is coupled to the pull-up node PU, a first electrode of the twenty-second transistor M22 is coupled to the second pull-down node PD_E, and a second electrode of the twenty-second transistor M22 is coupled to the second voltage terminal LVSS.

It will be noted that, first, transistors in some embodiments of the present disclosure may all be P-type transistors or N-type transistors. In addition, a first electrode of any one of the above transistors is a source electrode, and a second electrode of the one of the above transistors is a drain electrode; or, the first electrode of any one of the above transistors is a drain electrode, and the second electrode of the one of the above transistors is a source electrode.

Second, in a case where the pull-down control sub-circuit 80 is turned on, a constant high level is input via the fourth voltage terminal VDDO. In a case where the backup pull-down control sub-circuit 81 is turned on, a constant high level is input via the fifth voltage terminal VDDE.

Figure 10:
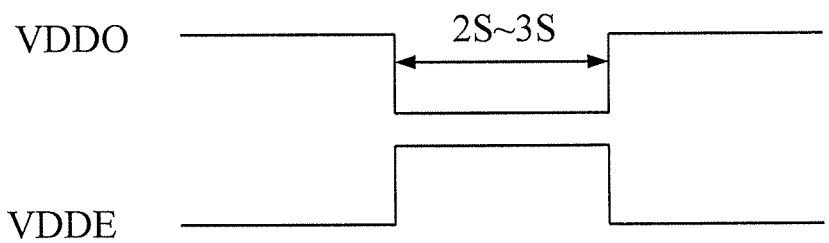
FIG. 10 is a schematic diagram showing signals of a fourth voltage terminal and a fifth voltage terminal in the shift register shown in FIG. 8.

It will be noted that, considering an actual output effect and the service life of the shift register, when a switching frequency of the backup pull-down control sub-circuit 81 and the pull-down control sub-circuit 80 is too high (for example, the backup pull-down control sub-circuit 81 and the pull-down control sub-circuit 80 are switched every 2 seconds), the signal output from the shift register may be unstable and the normal use of the shift register may be affected. In addition, when the switching frequency is too low (for example, the backup pull-down control sub-circuit 81 and the pull-down control sub-circuit 80 are switched every 3 seconds), it is not conducive to extending the service life of the shift register. Therefore, as shown in FIG. 10, in some embodiments, a switching period between the backup pull-down control sub-circuit 81 and the pull-down control sub-circuit 80 is 2-3 seconds.

Some embodiments of the present disclosure provide a method for driving a shift register. With the shift register shown in FIG. 2 as an example, the method includes the following steps.

A first voltage is input to the first gating signal terminal NC, and a second voltage is input to the second gating signal terminal SC. The second output sub-circuit 20 outputs a signal of the first clock signal terminal CK1 to the second output terminal OP under control of the first gating signal terminal NC and the pull-up node PU, and the third output sub-circuit 30 does not output signals under control of the second gating signal terminal SC and the pull-up node PU.

Or, the third output sub-circuit 30 outputs the signal of the second clock signal terminal CK2 to the second output terminal OP under control of the second gating signal terminal SC and the pull-up node PU, and the second output sub-circuit 20 does not output signals under control of the first gating signal terminal NC and the pull-up node PU.

It will be noted that, in a case where the second transistor M2 and the third transistor M3 are a same type of transistor, the first voltage and the second voltage are opposite in phase. For example, the second transistor M2 and the third transistor M3 are both N-type transistors. When the first voltage is at a high level and the second voltage is at a low level, the second output sub-circuit 20 outputs the signal of the first clock signal terminal CK1 to the second output terminal OP, and the third output sub-circuit 30 does not output signals. When the first voltage is at a low level and the second voltage is at a high level, the third output sub-circuit 30 outputs the signal of the second clock signal terminal CK2 to the second output terminal OP, and the second output sub-circuit 20 does not output signals.

Based on this, the first voltage is input to the first gating signal terminal NC, and the second voltage is input to the second gating signal terminal SC. In the output period of the shift register, the second output sub-circuit 20 may be made to output the signal of the first clock signal terminal CK1 to the second output terminal OP (i.e., output the signal of the first clock signal terminal CK1 to a gate line coupled to the second output terminal OP as a gate line scanning signal) under the control of the pull-up node PU and the first gating signal terminal NC, and the third output sub-circuit 30 does not output signals under the control of the second gating signal terminal SC and the pull-up node PU. In this case, the shift register is considered to be outputting signals in a normal order.

Or, the third output sub-circuit 30 outputs the signal of the second clock signal terminal CK2 to the second output terminal OP (i.e., outputs the signal of the second clock signal terminal CK2 as a gate line scanning signal to a gate line coupled to the second output terminal OP) under the control of the second gating signal terminal SC and the pull-up node PU. The second output sub-circuit 20 does not output signals under the control of the pull-up node PU and the first gating signal terminal NC. In this case, the shift register is considered to be outputting signals in an exceptional order.

In this way, the shift registers may be able to output signals in a normal order or in an exceptional order under the control of the selection sub-circuit 60.

In addition, no matter whether the shift registers output signals in a normal order or in an exceptional order, the first output sub-circuit 10 will output the signal of the first clock signal terminal CK1 to the first output terminal O_C under the control of the pull-up node PU. The first output terminal O_C may trigger a shift register coupled to the first output terminal O_C to enter a pre-charge stage, so that a pre-charging order of the stages of shift registers remains unchanged.

On this basis, since signals output from second output terminals OP of shift registers configured to be coupled to the gate lines and signals output from first output terminals O_C configured to maintain a cascading relationship of the stages of shift registers do not interfere with each other, when the stages of shift registers output signals in an exceptional order, the signals output in the exceptional order will not affect the relative relationship among the stages of shift registers and thus will not cause abnormal output of the gate driving circuit on the whole.

Processes of driving the shift register shown in FIG. 6 to output signals in a normal order and in an exceptional order are described in detail below. For convenience of explanation, a description is made by taking an example in which transistors are all N-type transistors.

A working period of the shift register, as shown in FIG. 12, includes three timing states: a first period P1, a second period P2, and a third period P3. In the working period, a constant low level is input via the first voltage terminal VSS and the second voltage terminal LVSS, and a constant high level is input via the third voltage terminal VGH. In a case where the pull-down control sub-circuit 80 is used, a constant high level is input via the fourth voltage terminal VDDO. In a case where the backup pull-down control sub-circuit 81 is used, a constant high level is input via the fifth voltage terminal VDDE.

Figure 11:
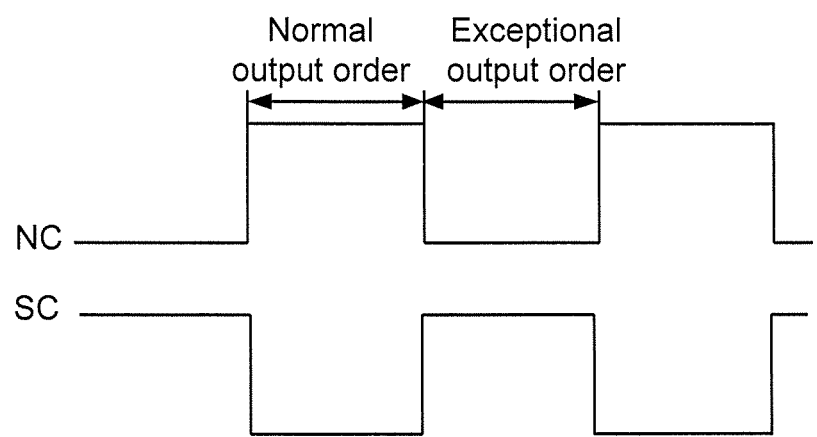
FIG. 11 is a schematic diagram showing signals of a first gating signal terminal and a second gating signal terminal in the shift register shown in FIG. 6.

In some embodiments of the present disclosure, since the second transistor M2 and the third transistor M3 are both N-type transistors, the signal of the first gating signal terminal NC and the signal of the second gating signal terminal SC are opposite in phase, as shown in FIG. 11. In a case where the shift registers output signals in a normal order, NC=1, and SC=0. In a case where the shift registers output signals in an exceptional order, NC=0, and SC=1.

In a case where a normal output order is selected (that is, when the signal of the first clock signal terminal CK1 is output from both the first output terminal O_C and the second output terminal OP), the first voltage is input to the first gating signal terminal NC, and the second voltage is input to the second gating signal terminal SC. In some embodiments of the present disclosure, the first voltage is at a high level, and the second voltage is at a low level. Within one image frame, the method includes the following steps.

In S1, in the first period P1, the pull-up control sub-circuit 70 outputs the voltage of the third voltage terminal VGH to the pull-up node PU under the control of the first input terminal INP1, so as to charge the pull-up node PU.

For example, NC=1, SC=0, INP1=1, and INP2=RESET (RST)=0, CK1=0, CK2=1, PU=1, and PD_O=0, wherein "1" represents a high level and "0" represents a low level. That is, the second transistor M2 is turned on, and the third transistor M3 is turned off.

In this case, the ninth transistor M9 is turned on under the control of the first input terminal INP1, and the high level of the third voltage terminal VGH is transmitted to the pull-up node PU through the ninth transistor M9.

The eleventh transistor M11 is turned on under the control of the fourth voltage terminal VDDO, and the high level of the fourth voltage terminal VDDO is output to the gate of the twelfth transistor M12. The twelfth transistor M12 is turned on, and the high level of the fourth voltage terminal VDDO is output to the first pull-down node PD_O.

The thirteenth transistor M13 and the fourteenth transistor M14 are turned on under the control of the pull-up node PU, and the potential at the first pull-down node PD_O is pulled down to a potential at the second voltage terminal LVSS through the fourteenth transistor M14. By setting a size ratio of the twelfth transistor M12 to the fourteenth transistor M14, the first pull-down node PD_O is set to be at a low level.

Under the control of the first gating signal terminal NC, the second transistor M2 is turned on. A signal from the pull-up node PU is transmitted to the gate of the four transistor M4, and the fourth transistor M4 is turned on. The low level of the first clock signal terminal CK1 is output to the second output terminal OP. Under the control of the pull-up node PU, the first transistor M1 is turned on, and the low level of the first clock signal terminal CK1 is output to the first output terminal O_C. This period is also referred to as the pre-charge period.

In S2, in the second period P2, under the control of the pull-up node PU, the second output sub-circuit 20 outputs the signal of the first clock signal terminal CK1 as a gate line scanning signal to the second output terminal OP, and the first output sub-circuit 10 outputs the signal of the first clock signal terminal CK1 to the first output terminal O_C.

For example, in the second period P2, NC=1, SC=0, INP1=0, INP2=RST=0, CK1=1, PU=1, and PD_O=0.

In this case, the potential at the pull-up node PU is further pulled up under a bootstrap action of the first capacitor C1. In this case, under the control of the pull-up node PU, the fourth transistor M4 is turned on, and the high level of the first clock signal terminal CK1 is output as a gate line scanning signal to the second output terminal OP, so as to scan a gate line coupled to the second output terminal OP. Moreover, under the control of the pull-up node PU, the first transistor M1 is turned on, and the high level of the first clock signal terminal CK1 is output to the first output terminal O_C. States of the twelfth transistor M12, the thirteenth transistor M13, and the fourteenth transistor M14 are the same as in the first period P1.

It can be known from the above that, since the gate line scanning signal is output from the second output terminal OP in the second period P2, the second period P2 is the output period of the shift register.

In S3, in the third period P3, the pull-up control sub-circuit 70 pulls down the potential at the pull-up node PU to a potential at the second voltage terminal LVSS under the control of the second input terminal INP2.

Under the control of the fourth voltage terminal VDDO, the pull-down control sub-circuit 80 outputs the voltage of the fourth voltage terminal VDDO to the first pull-down node PD_O. Under the control of the first pull-down node PD_O, the first pull-down sub-circuit 40 pulls down potentials at the pull-up node PU and the first output terminal O_C to a potential at the second voltage terminal LVSS, and the second pull-down sub-circuit 50 pulls down the potential at the second output terminal OP to a potential at the first voltage terminal VSS.

For example, in the third period P3, NC=1, SC=0, INP1=0, INP2=RST=1, CK1=0, PU=0, and PD_O=1.

In this case, under the control of the second input terminal INP2, the tenth transistor M10 is turned on, so as to pull down the potential at the pull-up node PU to the low level of the second voltage terminal LVSS. In this case, the thirteenth transistor M13 and the fourteenth transistor M14 are turned off.

Under the control of the fourth voltage terminal VDDO, the eleventh transistor M11 is turned on, and the high level of the fourth voltage terminal VDDO is output to the gate of the twelfth transistor M12. That is, the twelfth transistor M12 is turned on, and the high level of the fourth voltage terminal VDDO is output to the first pull-down node PD_O.

Under the control of the first pull-down node PD_O, the sixth transistor M6, the seventh transistor M7, and the eighth transistor M8 are turned on. In this case, the potential at the pull-up node PU is pulled down to the potential at the second voltage terminal LVSS through the seventh transistor M7. The potential at the second output terminal OP is pulled down to the potential at the first voltage terminal VSS through the eighth transistor M8. The potential at the first output terminal O_C is pulled down to the potential at the second voltage terminal LVSS through the sixth transistor M6.

In addition, before the next image frame begins, the potential at the pull-up node PU is always being pulled down to the low level of the second voltage terminal LVSS at least through the seventh transistor M7, and the potential at the first pull-down node PD_O is always kept at the high level through the eleventh transistor M11 and the twelfth transistor M12. Before the next image frame begins, the pull-down control sub-circuit 70 repeats the third period P3 above.

It can be known from above that, in the third period P3 and in a time period after the third period P3 and before the next image frame begins, a low level is always output from the second output terminal OP. Therefore, the third period P3 and the time period after the third period P3 and before the next image frame begins constitute the non-output period of the shift register.

It will be noted that, in the working period of the shift register, a constant low level is input via both the first voltage terminal VSS and the second voltage terminal LVSS. Some embodiments of the present disclosure do not limit voltages of the first voltage terminal VSS and the second voltage terminal LVSS.

Considering that the second output terminal OP is configured to output a gate line scanning signal to a gate line, in the non-output period of the shift register, in a case where the voltage of the first voltage terminal VSS is high, a leakage current of the eighth transistor M8 may be large, which makes it easy to cause crosstalk with signals output from other stages of shift registers. Therefore, in some embodiments, the voltage of the first voltage terminal VSS is smaller than the voltage of the second voltage terminal LVSS. For example, the voltage of the first voltage terminal VSS is −8V, while the voltage of the second voltage terminal LVSS is −11V. Herein, positive and negative signs of the voltage only indicate a direction of the voltage, and do not indicate a magnitude of the voltage.

On this basis, as shown in FIG. 12, after scanning one image frame, and before scanning the next image frame, the method further includes: the potential at the pull-up node PU is pulled down to the potential at the second voltage terminal LVSS under the control of the third input terminal INUPUT3 (INP3).

For example, a constant high level is input to the third input terminal INP3 (i.e., INP3=STV3=1). In this case, the fifteenth transistor M15 is turned on, and the potential at the pull-up node PU is pulled down to the potential at the second voltage terminal LVSS.

In this way, after scanning data of one image frame, and before scanning the next image frame, the data of the previous image frame may be discharged, so as to reduce an interference between signals of adjacent image frames, and enhance the display effect.

In summary, the shift register provided in some embodiments of the present disclosure may be able to output signals in a normal order.

In a case where an exceptional output order is selected (that is, when the signal of the first clock signal terminal CK1 is output from the first output terminal O_C, and the signal of the second clock signal terminal CK2 is output from the second output terminal OP), the first voltage is input to the first gating signal terminal NC, and the second voltage is input to the second gating signal terminal SC. In this case, signals are output via the first output terminal O_C in a same order as the normal output order, and what is different is that: in the first period P1, the second period P2, and the third period P3, NC=0, and SC=1, then the third transistor M3 is turned on, and the second transistor M2 is turned off. In this case, the second output sub-circuit 20 does not output signals.

Based on this, in a case where timings of the first clock signal terminal CK1 and the second clock signal terminal CK2 are shown as FIG. 12, in the output period of the shift register, since the third transistor M3 is turned on, the high level of the pull-up node PU is transmitted to the gate of the fifth transistor M5 through the third transistor M3. In this case, the fifth transistor M5 is turned on, and the low level of the second clock signal terminal CK2 is output to the second output terminal OP.

Figure 13:
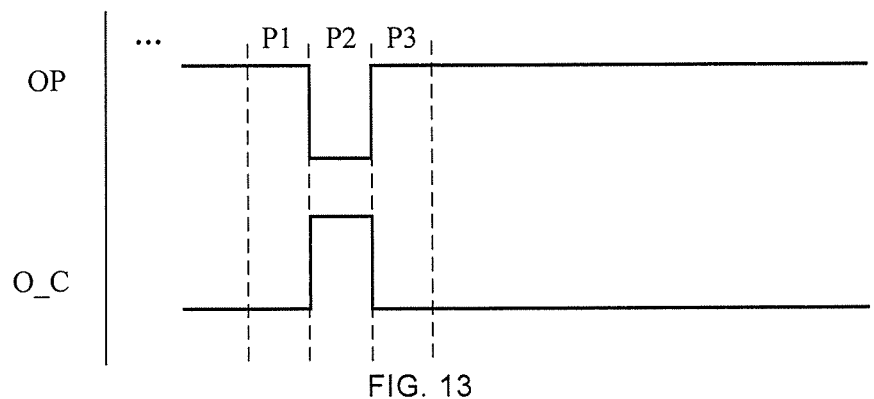
FIG. 13 is a schematic diagram showing signals of a first output terminal and a second output terminal in a case where the shift register shown in FIG. 6 outputs signals in an exceptional order.

In addition, in a case where the shift registers output signals in an exceptional order, a clock signal of the first clock signal terminal CK1 is different from a clock signal of the second clock signal terminal CK2. For example, the two signals are opposite in phase. Therefore, in a embodiment, as shown in FIG. 13, the signal output from the first output terminal O_C is in a low level, and the signal output from the second output terminal OP is in a high level. In this way, under the control of the selection sub-circuit 60, it may be realized that a shift register of a certain stage does not output a gate line scanning signal to a gate line coupled to the shift register, or outputs a specific gate line scanning signal to the gate line coupled to the shift register.

In summary, since the second output terminal OP is only configured to output a gate line scanning signal to a gate line coupled to the second output terminal OP, and is not configured to be coupled to other stages of shift registers, the signals output from the second output terminal OP do not affect normal operations of other stages of shift registers.

Usually, in the display process of a shift register, if one or more of the above transistors fail, the shift register may malfunction and may not be able to output signals properly. Consequently, the service life of the shift register may easily be reduced. In order to reduce an incidence of this problem, in some embodiments of the present disclosure, the method provided in some embodiments of the present disclosure further includes the following steps.

After the pull-down control sub-circuit 80 works for a period of time (for example, 2.5 s), the fourth voltage terminal VDDO is controlled to input a constant low level, so that the pull-down control sub-circuit 80 does not work (that is, the first pull-down node PD_O is made to be always kept at the low level).

The fifth voltage terminal VDDE is controlled to input a constant high level, so that the backup pull-down control sub-circuit 81 works. That is, in the third period P3, the backup pull-down control sub-circuit 81 outputs the voltage of the fifth voltage terminal VDDE to the second pull-down node PD_E under the control of the fifth voltage terminal VDDE.

The backup first pull-down sub-circuit 41 pulls down potentials at the pull-up node PU and the first output terminal O_C to the potential at the second voltage terminal LVSS under the control of the second pull-down node PD_E, and the backup second pull-down sub-circuit 51 pulls down the potential at the second output terminal OP to the potential at the first voltage terminal VSS under the control of the second pull-down node PD_E. Thus, backup units are formed to reduce a probability that the shift register cannot output signals properly due to a failure.

Methods for driving the backup pull-down control sub-circuit 81, the backup second pull-down sub-circuit 51 and the backup first pull-down sub-circuit 41 will be described below by taking an example in which the shift registers output signals in a normal order, as shown in FIG. 8.

In the third period P3, NC=1, SC=0, INP1=0, INP2=RST=1, CK1=0, PU=0, and PD_E=1.

In this case, under the control of the second input terminal INP2, the tenth transistor M10 is turned on, so as to pull down the potential at the pull-up node PU to the low level of the second voltage terminal LVSS. In this case, the twenty-first transistor M21 and the twenty-second transistor M22 are turned off.

Under the control of the fifth voltage terminal VDDE, the nineteenth transistor M19 is turned on, and the high level of the fifth voltage terminal VDDE is output to the gate of the twentieth transistor M20. The twentieth transistor M20 is turned on, and the high level of the fifth voltage terminal VDDE is output to the second pull-down node PD_E.

Under the control of the second pull-down node PD_E, the sixteenth transistor M16, the seventeenth transistor M17, and the eighteenth transistor M18 are turned on. In this case, the potential at the pull-up node PU is pulled down to the potential at the second voltage terminal LVSS through the seventeenth transistor M17, the potential at the second output terminal OP is pulled down to the potential at the first voltage terminal VSS through the eighteenth transistor M18, and the potential at the first output terminal O_C is pulled down to the potential at the second voltage terminal LVSS through the sixteenth transistor M16.

In addition, before the next image frame begins, the potential at the pull-up node PU is always being pulled down to the low level of the second voltage terminal LVSS at least through the seventeenth transistor M17, and the potential at the second pull-down node PD_E is always kept at the high level through the nineteenth transistor M19 and the twentieth transistor M20. Before the next image frame begins, the backup pull-down control sub-circuit 81 repeats the third period P3 above.

Some embodiments of the present disclosure provide a gate driving circuit, which includes a plurality of any one of the shift registers described above coupled in cascade.

IZhn some embodiments, as shown in FIGS. 14 and 15, first input terminals INP1 of a first-stage shift register, a second-stage shift register, and a third-stage shift register are coupled to a start signal terminal STV1.

Except for the first-stage shift register, the second-stage shift register, and the third-stage shift register, a first input terminal INP1 of an Nth-stage shift register is coupled to a first output terminal O_C of an (N−3)th-stage shift register. N is greater than 3 (N>3), and N is a positive integer.

It will be noted that, the gate driving circuit shown in FIG. 14 or 15 is illustrated by taking an example in which the gate driving circuit is coupled to six system clock signals, i.e., clock1 (abbreviated as ck1), clock2 (abbreviated as ck2), clock3 (abbreviated as ck3), clock4 (abbreviated as ck4), clock5 (abbreviated as ck5), and clock6 (abbreviated as ck6).

A number of shift registers coupled to the start signal terminal STV1 at a same time is related to a number of system clock signals coupled to the gate driving circuit. In some other embodiments of the present disclosure, in a case where the gate driving circuit is coupled to eight system clock signals, first input terminals INP1 of a first-stage shift register, a second-stage shift register, a third-stage shift register, and a fourth-stage shift register are coupled to the start signal terminal STV1. Except for the first-stage shift register, the second-stage shift register, the third-stage shift register, and the fourth-stage shift register, a first input terminal INP1 of an Mth-stage shift register is coupled to a first output terminal O_C of an (M−4)th-stage shift register. M is greater than or equal to 4 (M≥4), and M is a positive integer.

In addition, except for last four stages of shift registers, a second input terminal INP2 of an Kth-stage shift register is coupled to a first output terminal O_C of an (K+4)th-stage shift register, K is greater than or equal to 1, and K is a positive integer.

Second input terminals INP2 of the last four stages of shift registers are coupled to a second signal terminal STV2. In this case, a reset signal may be input to the second input terminals INP2 of the last four stages of shift registers located in a non-display area through the second signal terminal STV2, so as to reset the last four stages of shift registers.

It will be noted that, FIG. 15 is an illustration by taking an example in which the last four stages of shift registers are located in the non-display area. In some embodiments of the present disclosure, last five stages of shift registers may be disposed in the non-display area. In this case, second input terminals INP2 of the last five stages of shift registers may be coupled to the second signal terminal STV2.

Based on this, the signal of the gating signal terminal CT may be used to control the second output sub-circuit 20 to output signals, or control the third output sub-circuit 30 to output signals. In this way, the gate driving circuit is able to output signals in a normal order or in an exceptional order. Moreover, since signals output from second output terminals OP of shift registers configured to be coupled to the gate lines and signals output from first output terminals O_C configured to maintain a cascading relationship of the stages of shift registers do not interfere with each other, when the stages of shift registers output signals in an exceptional order, the signals output in the exceptional order will not affect the relative relationship among the stages of shift registers and thus will not cause abnormal output of the gate driving circuit on the whole.

On this basis, each stage of shift register further includes a third input terminal INP3, and the third input terminal INP3 of each stage of shift register is coupled to the third signal terminal STV3.

In this way, after scanning data of one image frame and before scanning the next image frame, the data of the previous image frame may be discharged, so as to reduce an interference between signals of adjacent image frames, and enhance the display effect.

Some embodiments of the present disclosure provide a display device, which includes the gate driving circuit described above. The gate driving circuit includes any one of the shift registers described above, which has the same structure and beneficial effects as the shift registers provided in the foregoing embodiments. Since the structure and beneficial effects of the shift register have been described in detail in the above embodiments, they will not be repeated here.

What is claimed is:

1. A shift register, comprising a first output sub-circuit, a second output sub-circuit, a third output sub-circuit, a first pull-down sub-circuit, a second pull-down sub-circuit, and a selection sub-circuit, wherein the first output sub-circuit is coupled to a pull-up node, a first output terminal, and a first clock signal terminal, and the first output sub-circuit is configured to output a signal from the first clock signal terminal to the first output terminal under control of the pull-up node;

the second output sub-circuit is coupled to the first clock signal terminal, the selection sub-circuit, and a second output terminal, and the second output sub-circuit is configured to output a signal from the first clock signal terminal to the second output terminal under control of the selection sub-circuit;

the third output sub-circuit is coupled to a second clock signal terminal, the selection sub-circuit, and the second output terminal, and the third output sub-circuit is configured to output a signal from the second clock signal terminal to the second output terminal under control of the selection sub-circuit;

the selection sub-circuit is coupled to the second output sub-circuit, the third output sub-circuit, the pull-up node, and a gating signal terminal, and the selection sub-circuit is configured, under control of the gating signal terminal, such that the second output sub-circuit outputs a signal from the first clock signal terminal under control of a signal from the pull-up node, or that the third output sub-circuit outputs a signal from the second clock signal terminal under control of a signal from the pull-up node;

the first pull-down sub-circuit is coupled to a first pull-down node, the first output terminal, a second voltage terminal, and the pull-up node, and the first pull-down sub-circuit is configured to pull down potentials at the first output terminal and the pull-up node to a potential at the second voltage terminal under control of the first pull-down node;

the second pull-down sub-circuit is coupled to the second output terminal, a first voltage terminal, and the first pull-down node, and the second pull-down sub-circuit is configured to pull down a potential at the second output terminal to a potential at the first voltage terminal under control of the first pull-down node.

2. The shift register according to claim 1, wherein the gating signal terminal includes a first gating signal terminal and a second gating signal terminal;

the selection sub-circuit is configured, under control of the first gating signal terminal, such that the second output sub-circuit outputs a signal from the first clock signal terminal under control of a signal from the pull-up node;

or, the selection sub-circuit is configured, under control of the second gating signal terminal, such that the third output sub-circuit outputs a signal from the second clock signal terminal under control of a signal from the pull-up node.

3. The shift register according to claim 1, wherein the first input sub-circuit includes a first transistor;

a gate of the first transistor is coupled to the pull-up node, a first electrode of the first transistor is coupled to the first clock signal terminal, and a second electrode of the first transistor is coupled to the first output terminal.

4. The shift register according to claim 2, wherein the selection sub-circuit includes a second transistor and a third transistor;

a gate of the second transistor is coupled to the first gating signal terminal, a first electrode of the second transistor is coupled to the second output sub-circuit, and a second electrode of the second transistor is coupled to the pull-up node;

a gate of the third transistor is coupled to the second gating signal terminal, a first electrode of the third transistor is coupled to the third output sub-circuit, and a second electrode of the third transistor is coupled to the pull-up node.

5. The shift register according to claim 4, wherein the second output sub-circuit includes a fourth transistor and a first capacitor;

a gate of the fourth transistor is coupled to the first electrode of the second transistor, a first electrode of the fourth transistor is coupled to the first clock signal terminal, and a second electrode of the fourth transistor is coupled to the second output terminal;

one electrode of the first capacitor is coupled to the pull-up node, and another electrode of the first capacitor is coupled to the second output terminal.

6. The shift register according to claim 4, wherein the third output sub-circuit includes a fifth transistor;

a gate of the fifth transistor is coupled to the first electrode of the third transistor, a first electrode of the fifth transistor is coupled to the second clock signal terminal, and a second electrode of the fifth transistor is coupled to the second output terminal.

7. The shift register according to claim 1, wherein the first pull-down sub-circuit includes a sixth transistor and a seventh transistor;

a gate of the sixth transistor is coupled to the first pull-down node, a first electrode of the sixth transistor is coupled to the first output terminal, and a second electrode of the sixth transistor is coupled to the second voltage terminal;

a gate of the seventh transistor is coupled to the first pull-down node, a first electrode of the seventh transistor is coupled to the pull-up node, and a second electrode of the seventh transistor is coupled to the second voltage terminal.

8. The shift register according to claim 1, wherein the second pull-down sub-circuit includes an eighth transistor;

a gate of the eighth transistor is coupled to the first pull-down node, a first electrode of the eighth transistor is coupled to the second output terminal, and a second electrode of the eighth transistor is coupled to the first voltage terminal.

9. The shift register according to claim 1, wherein the shift register further comprises a pull-up control sub-circuit and a pull-down control sub-circuit;

the pull-up control sub-circuit is coupled to a first input terminal, a second input terminal, the second voltage terminal, a third voltage terminal, and the pull-up node, and the pull-up control sub-circuit is configured to output a voltage from the third voltage terminal to the pull-up node under control of the first input terminal;

or, the pull-up control sub-circuit is configured to pull down a potential at the pull-up node to a potential at the second voltage terminal under control of the second input terminal;

the pull-down control sub-circuit is coupled to the pull-up node, the first pull-down node, the second voltage terminal, and a fourth voltage terminal, and the pull-down control sub-circuit is configured to output a voltage from the fourth voltage terminal to the first pull-down node under control of the fourth voltage terminal; or, the pull-down control sub-circuit is configured to pull down a potential at the first pull-down node to a potential at the second voltage terminal under control of the pull-up node.

10. The shift register according to claim 9, wherein the pull-up control sub-circuit includes a ninth transistor and a tenth transistor;
a gate of the ninth transistor is coupled to the first input terminal, a first electrode of the ninth transistor is coupled to the third voltage terminal, and a second electrode of the ninth transistor is coupled to the pull-up node;
a gate of the tenth transistor is coupled to the second input terminal, a first electrode of the tenth transistor is coupled to the pull-up node, and a second electrode of the tenth transistor is coupled to the second voltage terminal.

11. The shift register according to claim 9, wherein the pull-down control sub-circuit includes an eleventh transistor, a twelfth transistor, a thirteenth transistor, and a fourteenth transistor;
a gate and a first electrode of the eleventh transistor are coupled to the fourth voltage terminal, and a second electrode of the eleventh transistor is coupled to a first electrode of the thirteenth transistor and a gate of the twelfth transistor;
a first electrode of the twelfth transistor is coupled to the fourth voltage terminal, and a second electrode of the twelfth transistor is coupled to the first pull-down node;
a gate of the thirteenth transistor is coupled to the pull-up node, and a second electrode of the thirteenth transistor is coupled to the second voltage terminal;
a gate of the fourteenth transistor is coupled to the pull-up node, a first electrode of the fourteenth transistor is coupled to the first pull-down node, and a second electrode of the fourteenth transistor is coupled to the second voltage terminal.

12. The shift register according to claim 1, wherein the shift register further comprises a discharging sub-circuit;
the discharging sub-circuit is coupled to a third input terminal, the pull-up node, and the second voltage terminal, and the discharging sub-circuit is configured to pull down a potential at the pull-up node to a potential at the second voltage terminal under control of the third input terminal.

13. The shift register according to claim 12, wherein the discharging sub-circuit includes a fifteenth transistor;
a gate of the fifteenth transistor is coupled to the third input terminal, a first electrode of the fifteenth transistor is coupled to the pull-up node, and a second electrode of the fifteenth transistor is coupled to the second voltage terminal.

14. The shift register according to claim 9, wherein the shift register further comprises a backup first pull-down sub-circuit, a backup second pull-down sub-circuit, and a backup pull-down control sub-circuit;
the backup first pull-down sub-circuit is coupled to a second pull-down node, the first output terminal, the second voltage terminal, and the pull-up node, and the backup first pull-down sub-circuit is configured to pull down potentials at the first output terminal and the pull-up node to a potential at the second voltage terminal under control of the second pull-down node;
the backup second pull-down sub-circuit is coupled to the second output terminal, the first voltage terminal, and the second pull-down node, and the backup second pull-down sub-circuit is configured to pull down a potential at the second output terminal to a potential at the first voltage terminal under control of the second pull-down node;
the backup pull-down control sub-circuit is coupled to the pull-up node, the second pull-down node, the second voltage terminal, and a fifth voltage terminal, and the backup pull-down control sub-circuit is configured to output a voltage from the fifth voltage terminal to the second pull-down node under control of the fifth voltage terminal; or, the backup pull-down control sub-circuit is configured to pull down a potential at the second pull-down node to a potential at the second voltage terminal under control of the pull-up node.

15. The shift register according to claim 14, wherein the backup first pull-down sub-circuit includes a sixteenth transistor and a seventeenth transistor;
a gate of the sixteenth transistor is coupled to the second pull-down node, a first electrode of the sixteenth transistor is coupled to the first output terminal, and a second electrode of the sixteenth transistor is coupled to the second voltage terminal;
a gate of the seventeenth transistor is coupled to the second pull-down node, a first electrode of the seventeenth transistor is coupled to the pull-up node, and a second electrode of the seventeenth transistor is coupled to the second voltage terminal.

16. The shift register according to claim 14, wherein the backup second pull-down sub-circuit includes an eighteenth transistor;
a gate of the eighteenth transistor is coupled to the second pull-down node, a first electrode of the eighteenth transistor is coupled to the second output terminal, and a second electrode of the eighteenth transistor is coupled to the first voltage terminal.

17. The shift register according to claim 14, wherein the backup pull-down control sub-circuit includes a nineteenth transistor, a twentieth transistor, a twenty-first transistor, and a twenty-second transistor;
a gate and a first electrode of the nineteenth transistor are coupled to the fifth voltage terminal, and a second electrode of the nineteenth transistor is coupled to a first electrode of the twenty-first transistor and a gate of the twentieth transistor;
a first electrode of the twentieth transistor is coupled to the fifth voltage terminal, and a second electrode of the twentieth transistor is coupled to the second pull-down node;
a gate of the twenty-first transistor is coupled to the pull-up node, and a second electrode of the twenty-first transistor is coupled to the second voltage terminal;
a gate of the twenty-second transistor is coupled to the pull-up node, a first electrode of the twenty-second transistor is coupled to the second pull-down node, and a second electrode of the twenty-second transistor is coupled to the second voltage terminal.

18. A method for driving the shift register according to claim 1, wherein the gating signal terminal includes a first gating signal terminal and a second gating signal terminal, the method comprising:
inputting a first voltage to the first gating signal terminal, and inputting a second voltage to the second gating signal terminal;

outputting, by the second output sub-circuit, a signal from the first clock signal terminal to the second output terminal under control of the first voltage output from the first gating signal terminal and the pull-up node; and controlling the third output sub-circuit not to output signals by using the second voltage output from the second gating signal terminal and the pull-up node;

or, outputting, by the third output sub-circuit, a signal from the second clock signal terminal to the second output terminal under control of the second voltage output from the second gating signal terminal and the pull-up node; and controlling the second output sub-circuit not to output signals by using the first voltage output from the first gating signal terminal and the pull-up node.

19. A gate driving circuit, comprising a plurality of shift registers according to claim 1 coupled in cascade, wherein first input terminals of a first-stage shift register, a second-stage shift register, and a third-stage shift register are coupled to a start signal terminal;

except for the first-stage shift register, the second-stage shift register, and the third-stage shift register, a first input terminal of an Nth-stage shift register is coupled to a first output terminal of an (N−3)th-stage shift register, wherein N is greater than 3, and N is a positive integer;

except for last four stages of shift registers, a second input terminal of an Kth-stage shift register is coupled to a first output terminal of an (K+4)th-stage shift register, K is greater than or equal to 1, and K is a positive integer; and second input terminals of the last four stages of shift registers are coupled to a second signal terminal.

20. A display device, comprising the gate driving circuit according to claim 19.

* * * * *